United States Patent
Sato et al.

(10) Patent No.: US 7,521,777 B2
(45) Date of Patent: Apr. 21, 2009

(54) GALLIUM NITRIDE-BASED COMPOUND SEMICONDUCTOR MULTILAYER STRUCTURE AND PRODUCTION METHOD THEREOF

(75) Inventors: Hisao Sato, Ichihara (JP); Hisayuki Miki, Ichihara (JP)

(73) Assignee: Showa Denko K.K., Tokyo (JP)

( * ) Notice: Subject to any disclaimer, the term of this patent is extended or adjusted under 35 U.S.C. 154(b) by 168 days.

(21) Appl. No.: 11/392,767

(22) Filed: Mar. 30, 2006

(65) Prior Publication Data
US 2006/0219998 A1 Oct. 5, 2006

Related U.S. Application Data

(60) Provisional application No. 60/670,236, filed on Apr. 12, 2005.

(30) Foreign Application Priority Data
Mar. 31, 2005 (JP) ............................. 2005-104963

(51) Int. Cl.
*H01L 21/4763* (2006.01)
(52) U.S. Cl. ............... 257/628; 257/103; 257/E21.108; 257/E33.003
(58) Field of Classification Search ................ 257/11, 257/13, 14, 103, 15, 21, 628, E21.108, E33.003; 439/46, 47, 143, 700
See application file for complete search history.

(56) References Cited

U.S. PATENT DOCUMENTS

| | | | |
|---|---|---|---|
| 5,804,839 A * | 9/1998 | Hanaoka et al. | 257/103 |
| 6,608,330 B1 * | 8/2003 | Yamada | 257/90 |
| 2001/0030329 A1 * | 10/2001 | Ueta et al. | 257/103 |
| 2003/0160229 A1 | 8/2003 | Narayan et al. | |
| 2003/0160246 A1 | 8/2003 | Narayan et al. | |
| 2006/0189012 A1 * | 8/2006 | Ueta et al. | 438/21 |
| 2006/0237709 A1 * | 10/2006 | Lee et al. | 257/11 |
| 2007/0026551 A1 * | 2/2007 | Sato et al. | 438/22 |
| 2007/0170457 A1 * | 7/2007 | Kobayakawa et al. | 257/103 |
| 2007/0187666 A1 * | 8/2007 | Watanabe et al. | 257/13 |
| 2008/0048172 A1 * | 2/2008 | Muraki et al. | 257/13 |

FOREIGN PATENT DOCUMENTS

| | | |
|---|---|---|
| JP | 10-79501 | 3/1998 |
| JP | 10-145000 | 5/1998 |
| JP | 11-354839 | 12/1999 |
| JP | 2001-68733 | 3/2001 |

* cited by examiner

*Primary Examiner*—Zandra Smith
*Assistant Examiner*—Telly D Green
(74) *Attorney, Agent, or Firm*—Sughrue Mion, PLLC

(57) ABSTRACT

The object of the present invention is to provide a gallium nitride-based compound semiconductor multilayer structure useful for manufacturing a gallium nitride-based compound semiconductor light-emitting device which requires a low operating voltage and from which a good emission output can be obtained. The present gallium nitride-based compound semiconductor multilayer structure comprises a substrate having thereon an n-type layer, a light-emitting layer and a p-type layer, the light-emitting layer having a multiple quantum well structure in which a well layer and a barrier layer are alternately stacked repeatedly and the light-emitting layer being provided between the n-type layer and the p-type layer, wherein the well layers consisting of the multiple quantum well structure comprise a well layer having an ununiform thickness and a well layer having a uniform thickness.

21 Claims, 14 Drawing Sheets

| WELL LAYWR | MAXIMUM THICKNESS | MINIMUM THICKNESS |
|---|---|---|
| 1 | 3.0 | 2.8 |
| 2 | 3.1 | 2.5 |
| 3 | 3.1 | 2.5 |
| 4 | 3.1 | 2.2 |
| 5 | 3.0 | 2.3 |

(nm)

| WELL LAYWR | MAXIMUM THICKNESS | MINIMUM THICKNESS |
|---|---|---|
| 1 | 3.0 | 2.9 |
| 2 | 3.1 | 2.2 |
| 3 | 2.8 | 2.1 |
| 4 | 3.1 | 2.2 |
| 5 | 3.2 | 2.1 |

(nm)

| WELL LAYWR | MAXIMUM THICKNESS | MINIMUM THICKNESS |
|---|---|---|
| 1 | 3.0 | 2.8 |
| 2 | 3.1 | 2.5 |
| 3 | 3.0 | 1.9 |
| 4 | 2.8 | 2.2 |
| 5 | 3.0 | 2.0 |

↑ SURFACE SIDE

WELL LAYER-1
WELL LAYER-2
WELL LAYER-3
WELL LAYER-4
WELL LAYER-5

↓ SUBSTRATE SIDE          PART 4

(nm)

| WELL LAYWR | MAXIMUM THICKNESS | MINIMUM THICKNESS |
|---|---|---|
| 1 | 3.0 | 2.8 |
| 2 | 3.2 | 1.8 |
| 3 | 3.0 | 2.5 |
| 4 | 2.8 | 2.3 |
| 5 | 3.0 | 1.7 |

| WELL LAYER | MAXIMUM THICKNESS | MINIMUM THICKNESS |
|---|---|---|
| 1 | 3.1 | 2.8 |
| 2 | 2.7 | 2.0 |
| 3 | 2.9 | 2.1 |
| 4 | 2.8 | 1.6 |
| 5 | 2.9 | 2.5 |

(nm)

| WELL LAYWR | MAXIMUM THICKNESS | MINIMUM THICKNESS |
|---|---|---|
| 1 | 3.0 | 2.8 |
| 2 | 3.2 | 2.5 |
| 3 | 3.1 | 1.9 |
| 4 | 3.0 | 2.2 |
| 5 | 2.9 | 1.9 |

(nm)

| WELL LAYWR | MAXIMUM THICKNESS | MINIMUM THICKNESS |
|---|---|---|
| 1 | 3.1 | 2.9 |
| 2 | 2.8 | 1.9 |
| 3 | 2.9 | 2.5 |
| 4 | 2.9 | 2.2 |
| 5 | 3.2 | 2.5 |

(nm)

Fig.17
↑ SURFACE SIDE
↓ SUBSTRATE SIDE
Fig.18
↑ SURFACE SIDE
↓ SUBSTRATE SIDE

GALLIUM NITRIDE-BASED COMPOUND SEMICONDUCTOR MULTILAYER STRUCTURE AND PRODUCTION METHOD THEREOF

CROSS REFERENCE TO RELATED APPLICATION

This application is an application filed under 35 U.S.C. §111(a) claiming benefit, pursuant to 35 U.S.C. §119(e)(1), of the filing date of the Provisional Application No. 60/670,236 filed on Apr. 12, 2005, pursuant to 35 U.S.C. §111(b).

TECHNICAL FIELD

The present invention relates to a gallium nitride-based compound semiconductor multilayer structure useful for producing a high-power light-emitting device which emits ultraviolet to blue light, or green light, and to a method for producing the semiconductor multilayer structure.

BACKGROUND ART

In recent years, gallium nitride-based compound semiconductors have become of interest as materials for producing a light-emitting device which emits light of short wavelength. Generally, a gallium nitride-based compound semiconductor is grown on a substrate made of an oxide crystal such as a sapphire single crystal, a silicon carbide single crystal, or a Group III-V compound single crystal, through a method such as metal-organic chemical vapor deposition (MOCVD), molecular-beam epitaxy (MBE), or hydride vapor phase epitaxy (HVPE).

At present, the crystal growth method that is most widely employed in the industry includes growing a semiconductor crystal on a substrate such as sapphire, SiC, GaN, or AlN, through metal-organic chemical vapor deposition (MOCVD). Specifically, an n-type layer, a light-emitting layer, and a p-type layer are grown on the aforementioned substrate placed in a reactor tube, by use of a Group III organometallic compound and a Group V source gas at about 700° C. to about 1,200° C.

After growth of the above layers, a negative electrode is formed on the substrate or the n-type layer, and a positive electrode is formed on the p-type layer, whereby a light-emitting device is fabricated.

Conventionally, such a light-emitting layer is formed from InGaN whose composition is controlled so as to modulate the light emission wavelength. The active layer is sandwiched by layers having a bandgap higher than that of InGaN, thereby forming a double-hetero structure, or is incorporated into a multiple quantum well structure on the basis of the quantum well effect.

In a gallium nitride-based compound semiconductor light-emitting device having a light-emitting layer of a multiple quantum well structure, when the thickness of a well layer is adjusted to 2 to 3 nm, satisfactory output is attained, but a problematically high operating voltage is required. In contrast, when the thickness of the well layer is 2 nm or less, the operating voltage is lowered, but the output is poor.

Further, a quantum dot structure as described below, in which light-emitting layers are formed in a dot form, is suggested to improve the emission output.

For example, in Japanese Laid-Open Patent Application (kokai) No. 10-79501, Japanese Laid-Open Patent Application (kokai) No. 11-354839, etc., a light-emitting device containing a light-emitting layer having a quantum dot structure is disclosed. The quantum dot structure is formed according to the anti-surfactant effect. According to Japanese Laid-Open Patent Application (kokai) No. 11-354839, the size of each light-emitting device is preferably such that 0.5 nm≦height≦50 nm, 0.5 nm≦width≦200 nm, and $10^6$≦density≦$10^{13}$ cm$^{-2}$. In examples, the light-emitting device having a height of 6 nm and a width of 40 nm is produced.

However, a part which is not covered with quantum dots is a region having an extremely low resistance in comparison with a dot region, whereby the current is preferentially applied thereto and the non-dot part does not contribute to light-emission. Therefore, the quantum dot structure thus suggested has a problem that the emission output with respect to the applied current is decreased as a whole, although the emission efficiency of each light-emitting dot is improved.

Japanese Laid-Open Patent Application (kokai) No. 2001-68733 discloses a quantum box structure containing In. According to Japanese Laid-Open Patent Application (kokai) No. 2001-68733, the quantum box structure is formed by annealing, in hydrogen, a quantum well structure once produced, whereby the well layer is sublimated. In examples, the quantum box has a size of not more than 200 Å, for example, the size of 20 Å×20 Å×20 Å. The density of the light-emitting box is not defined. However, it can be seen from the drawings that the area which is covered with the light-emitting box is the same as or smaller than the area which is not covered with the light-emitting box.

In short, in these technologies, it is defined that the region where no quantum dot or quantum box is formed has a structure where no dot or box is formed. Therefore, the region where no quantum dot or quantum box is formed is a region having an extremely low resistance in comparison with the region where a quantum dot or a quantum box is formed, whereby the current is preferentially applied to the region where no quantum dot or quantum box is formed.

The structure, in which no light-emitting elements are provided in a region not covered with a dot or a box, has a problem that the emission output is decreased although the operating voltage is effectively decreased, and it cannot be practically used.

Japanese Laid-Open Patent Application (kokai) No. 2001-68733 also discloses that a quantum box structure is fabricated by forming a conventional quantum well structure and annealing the structure in hydrogen, thereby decomposing an InGaN crystal provided on through-hole dislocations. However, annealing a quantum well structure in hydrogen induces release of In from a portion intended to serve as a quantum box structure, thereby blue-shifting the emission wavelength, which is not preferred.

Also, in US Patent Application Publication No. US2003/0160229A1, a light-emitting layer having a multiple quantum well structure in which the thickness of the well layer is partially changed is suggested to obtain a highly efficient light-emission. In the specification thereof, at least from the attached drawings, it is found that all the well layers are irregular in thickness.

SUMMARY OF THE INVENTION

The object of the present invention is to provide a gallium nitride-based compound semiconductor multilayer structure useful for manufacturing a gallium nitride-based compound semiconductor light-emitting device which requires a low operating voltage and from which a good emission output can be obtained.

The present invention provides the following.

(1) A gallium nitride-based compound semiconductor multilayer structure comprising a substrate having thereon a n-type layer, a light-emitting layer and a p-type layer, the light-emitting layer having a multiple quantum well structure in which a well layer and a barrier layer are alternately stacked repeatedly and the light-emitting layer being provided between the n-type layer and the p-type layer, wherein the well layers consisting of the multiple quantum well structure comprise a well layer having an ununiform thickness and a well layer having a uniform thickness.

(2) The gallium nitride-based compound semiconductor multilayer structure according to (1) above, wherein the thickness of the well layer closest to the p-type layer is uniform.

(3) The gallium nitride-based compound semiconductor multilayer structure according to (1) or (2) above, wherein the thickness of the well layer closest to the n-type layer is uniform.

(4) The gallium nitride-based compound semiconductor multilayer structure according to any one of (1) to (3) above, wherein the thickness of a well layer having a uniform thickness is 1.8 to 5 nm.

(5) The gallium nitride-based compound semiconductor multilayer structure according to any one of (1) to (4) above, wherein the thickness of a thin part of a well layer having an ununiform thickness is not more than 2.7 nm.

(6) The gallium nitride-based compound semiconductor multilayer structure according to any one of (1) to (5) above, wherein the multiple quantum well structure comprises 3 to 10 stacks of the well layer and the barrier layer.

(7) The gallium nitride-based compound semiconductor multilayer structure according to any one of (1) to (6) above, wherein the barrier layer comprises a gallium nitride-based compound semiconductor selected from the group consisting of GaN, AlGaN and InGaN having a In ratio smaller than that of InGaN which forms the well layer.

(8) The gallium nitride-based compound semiconductor multilayer structure according to (7) above, wherein the barrier layer comprises GaN.

(9) The gallium nitride-based compound semiconductor multilayer structure according to any one of (1) to (8) above, wherein the barrier layer contains a dopant.

(10) The gallium nitride-based compound semiconductor multilayer structure according to (9) above, wherein the dopant is at least one selected from the group consisting of C, Si, Ge, Sn, Pb, O, S, Se, Te, Po, Be, Mg, Ca, Sr, Ba and Ra.

(11) The gallium nitride-based compound semiconductor multilayer structure according to (9) or (10) above, wherein the concentration of the dopant is from $1 \times 10^{17}$ to $1 \times 10^{18}$ $cm^{-3}$.

(12) The gallium nitride-based compound semiconductor multilayer structure according to any one of (1) to (11) above, wherein the thickness of the barrier layer is from 7 to 50 nm.

(13) The gallium nitride-based compound semiconductor multilayer structure according to (12) above, wherein the thickness of the barrier layer is at least 14 nm.

(14) The gallium nitride-based compound semiconductor multilayer structure according to any one of (1) to (13) above, wherein the well layer contains In.

(15) The gallium nitride-based compound semiconductor multilayer structure according to (14) above, wherein a thin layer containing no In is provided on at least the substrate side of the barrier layer.

(16) A gallium nitride-based compound semiconductor light-emitting device, wherein the device has a negative electrode and a positive electrode, the negative electrode and the positive electrode being provided on the n-type layer and the p-type layer of a gallium nitride-based compound semiconductor multilayer structure according to any one of (1) to (15) above, respectively.

(17) A lamp in which the gallium nitride-based compound semiconductor light-emitting device according to (16) above is used.

(18) A method for manufacturing the gallium nitride-based compound semiconductor multilayer structure according to any one of (1) to (15) above, wherein after a well layer is formed, the layer thus formed is partly decomposed or sublimated to provide an ununiform thickness.

(19) The method for manufacturing a gallium nitride-based compound semiconductor multilayer structure, according to (18) above, wherein the substrate temperature T1 during forming the well layer and the substrate temperature T2 during decomposing or sublimating a part of the well layer satisfy the formula: $T1 \leq T2$.

(20) The method for manufacturing a gallium nitride-based compound semiconductor multilayer structure, according to (18) or (19) above, wherein the decomposition or sublimation of a part of the well layer is conducted in an atmosphere containing a nitrogen source and containing no III group metal source.

(21) The method for manufacturing a gallium nitride-based compound semiconductor multilayer structure, according to any one of (18) to (20) above, wherein the decomposition or sublimation of a part of the well layer is conducted during forming the barrier layer.

According to the present invention, whose main subject is to have a well layer having an ununiform thickness and a well layer having a uniform thickness in well layers of a multiple quantum well structure which forms a light-emitting layer, a gallium nitride-based compound semiconductor light-emitting device which maintains a good emission output, and exhibits a low operating voltage, can be obtained.

Further, a gallium nitride-based compound semiconductor light-emitting device obtained by the present invention exhibits less deterioration of the peak inverse voltage characteristics.

The light emitted from the well layer can be prevented from being shifted to a shorter wavelength, by forming a well layer having an ununiform thickness in the presence of a nitrogen source.

BRIEF DESCRIPTION OF DRAWINGS

FIG. 17 is another exemplary cross-section TEM photograph of the gallium nitride-based compound semiconductor multilayer structure fabricated in Example 1.

FIG. 18 is another exemplary cross-section TEM photograph of the gallium nitride-based compound semiconductor multilayer structure fabricated in Example 1.

DETAILED DESCRIPTION OF THE INVENTION

Figure 1:
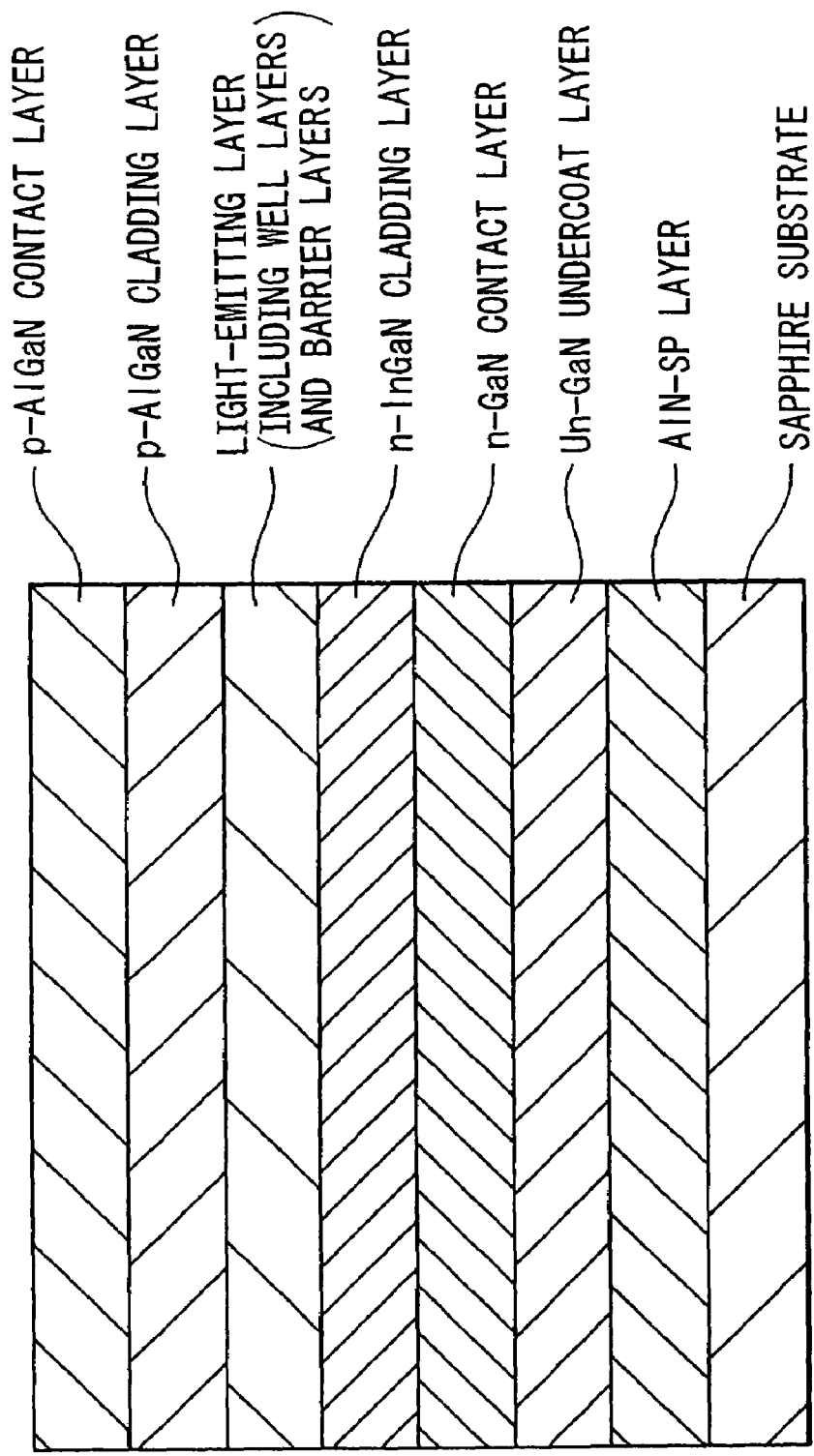
FIG. 1 is a schematic view of a cross-section of the gallium nitride-based compound semiconductor multilayer structure fabricated in Example and Comparative Example.

The n-type layer, light-emitting layer, and p-type layer of a gallium nitride-based compound semiconductor light-emitting device are widely known to be formed from a variety of gallium nitride-based compound semiconductors represented by formula: $Al_xIn_yGa_{1-x-y}N$ ($0 \leq x<1$; $0 \leq y<1$; $0 \leq x+y<1$). No particular limitation is imposed on the gallium nitride-based compound semiconductor for forming the n-type layer, the light-emitting layer, and the p-type layer employed in the present invention, and a variety of gallium nitride-based compound semiconductors represented by formula: $Al_xIn_yGa_{1-x-y}N$ ($0 \leq x<1$; $0 \leq y<1$; $0 \leq x+y<1$) may also be employed.

No particular limitation is imposed on the type of the substrate, and there may be employed conventionally known substrate species such as sapphire, SiC, GaP, GaAs, Si, ZnO, and GaN.

In order to form a gallium nitride-based compound semiconductor on any of the above substrates (excepting a GaN substrate) which are not theoretically lattice-matched with the gallium nitride-based compound, a low-temperature buffer method (disclosed in, for example, Japanese Patent 3026087 and Japanese Laid-Open Patent Application (kokai) No. 4-297023) and a lattice-mismatch crystal epitaxial growth technique (disclosed in, for example, Japanese Laid-Open Patent Application (kokai) No. 2003-243302), which is called "seeding process (SP)," may be employed. Among these methods, from the viewpoint of productivity and other factors, the SP method is a particularly advantageous lattice-mismatch crystal epitaxial growth technique which can produce AlN crystal film at such a high temperature that enables formation of GaN crystals.

When a lattice-mismatch crystal epitaxial growth technique such as a low-temperature buffer method or an SP method is employed, the gallium nitride-based compound semiconductor for an undercoat layer on which a semiconductor is formed is preferably GaN which is undoped or lightly doped (dopant concentration is about $5 \times 10^{17}$ cm$^{-3}$). The undercoat layer preferably has a thickness of 1 to 20 μm, more preferably 5 to 15 μm. An n-type layer, a light-emitting layer and a p-type layer are stacked on the undercoat layer in this order.

In the present invention, the well layers included in a multiple quantum well structure for forming a light-emitting layer always comprise a well layer having a uniform thickness and a well layer having an ununiform thickness. In the present invention, "uniform thickness" means that the thicknesses of all parts of a layer are included in the range of ±10%, preferably ±7%, with respect to the average thickness. "Ununiform thickness" means that the thickness of at least a part of a layer is not in the range of ±10% of the average thickness. "Average thickness" is an arithmetic average of the maximum thickness and the minimum thickness of the layer. In a well layer having an ununiform thickness, a part having a thickness larger than the average thickness is designated to "a thick part" and a part having a thickness smaller than the average thickness is designated to "a thin part".

Whether the thickness of each well layer is uniform or ununiform is measured and determined by a cross-sectional TEM photograph of a gallium nitride-based compound semiconductor. For example, the variation in the thicknesses of each well layer can be measured by observing the cross-section in a TEM photograph of 200,000 to 2,000,000 magnifications. FIGS. 3 to 10 are cross-sectional TEM photographs of 1,000,000 magnifications of a chip produced according to Example 1. The thickness can be calculated based on the magnification. The maximum thickness and the minimum thickness of each well layer in each figure are described in the table attached to each figure. Whether the thickness of each well layer is uniform or ununiform can be determined from the maximum thickness and the minimum thickness of each well layer calculated from the eight figures. A thick part has a thickness larger than the average thickness which is an arithmetic average of the maximum thickness and the minimum thickness, and a thin part has a thickness smaller than the average thickness. In the drawings, A represents a thick part and B represents a thin part. The maximum thickness and the minimum thickness of each well layer is calculated by observing plural parts of a cross-sectional TEM photograph at, for example, least eight parts at a pitch of 20 μm.

When the thicknesses of all well layers in the multiple quantum well structure forming a light-emitting layer are ununiform, in comparison with the case in which the thicknesses of all well layers are uniform, the operating voltage is lower and the emission output is the same or lower. However, if the thicknesses of all well layers are not ununiform and the thickness of a part of well layers is uniform, the operating voltage is decreased and the emission output is increased. The reason for the above is not known. Particularly, when the thickness of the well layer closest to the p-type layer or the n-type layer is uniform, the emission output is effectively increased. When the thicknesses of the well layer closest to the p-type layer and of the well layer closest to the n-type layer are uniform, the emission output is effectively increased but the operating voltage is not effectively decreased. Therefore, well layers having uniform thicknesses can include the well layer closest to the p-type layer and the well layer closest to the n-type layer, and preferably include one of them. It is particularly preferable to have the well layer closest to the p-type layer as a well layer having an uniform thickness.

If the number of well layers having uniform thicknesses is increased, the operating voltage is not effectively decreased. Accordingly, the number of well layers having uniform thicknesses is at least 1 and preferably not more than 60%, more preferably not more than 40%, of the total number of well layers.

The thickness of a well layer having a uniform thickness is preferably 1.8 to 5 nm. If the thickness is out of this range, the emission output is decreased. The thickness is more preferably in the range of 2.0 to 3.5 nm.

The thickness of a thick part of a well layer having an ununiform thickness is preferably about 1.8 to 5 nm. If the thickness of the thick part is out of this range, the emission output is decreased. The thickness is more preferably in the range of 2.3 to 3.5 nm. The width of the thick part is preferably 10 to 5,000 nm, more preferably 20 to 1,000 nm.

The area of the thick part preferably accounts for 30 to 90% the entire area of the well layer. When the area falls within the range, lowering of operating voltage and increasing emission output can be attained. More preferably, the area of the thick part accounts for 60 to 90% the entire area of the well layer. The area ratio of the thick part and that of the thin part can be calculated from the width as measured from a cross-section TEM photograph.

The thin part has a width of 1 to 200 nm, more preferably 5 to 150 nm.

The difference in thickness between the thick part and the thin part preferably falls within a range of about 1 to 3 nm. The thickness of the thin part preferably falls within a range of 1.0 to 2.7 nm.

The well layer may include a thin part having a thickness of 0. In other words, the well layer may include an area that is not covered with a well layer. However, such an area is preferably narrow in order to prevent lowering of emission output. Thus, the area preferably accounts for 30% or less the entire area of the well layer, more preferably 20% or less, particularly preferably 10% or less. The area ratio can be calculated from the width as measured from a cross-section TEM photograph.

The well layer is preferably formed of a gallium nitride-based compound semiconductor containing In, because the In-containing gallium nitride-based compound semiconductor is of a crystal for readily attaining a structure having a thick part and a thin part. In addition, the In-containing gallium nitride-based compound semiconductor can emit high-intensity light in a blue light region.

The barrier layer may be formed of GaN, AlGaN, and InGaN which has an In content lower than that of InGaN forming a well layer. Among them, GaN is preferred.

The barrier layer may comprise a stacked structure of plural layers. When the well layer is a gallium nitride-based compound semiconductor containing In, it is preferable to provide a thin layer containing no In on at least one side of the barrier layer attached to the well layer of the substrate side. It is preferable that the decomposition and sublimation of In in the well layer can be inhibited and that the emission wavelength can be stably controlled, by forming the thin layer. The thin layer is preferably provided at a substrate temperature same as the growing temperature of the well layer.

When a dopant is doped into the barrier layer, the operating voltage is preferably decreased. As an element for the dopant, C, Si, Ge, Sn, Pb, O, S, Se, Te, Po, Be, Mg, Ca, Sr, Ba and Ra can be exemplified. Among those, Si and Ge are preferable and Si is the most preferable.

The concentration of the dopant is preferably $5\times10^{16}$ to $1\times10^{18}$ cm$^{-3}$. If the concentration is less than $5\times10^{16}$ cm$^{-3}$, the operating voltage is not effectively decreased. If the concentration is more than $1\times10^{18}$ cm$^{-3}$, the peak inverse voltage characteristics tend to be degraded. The concentration is more preferably $1\times10^{17}$ to $5\times10^{17}$ cm$^{-3}$.

The thickness of the barrier layer is preferably at least 7 nm, more preferably at least 14 nm. If the barrier layer is thin, the gap between the thicknesses of a thick part and a thin part of a well layer cannot be filled and as a result, formation of the thick part and the thin part of the well layer is prohibited, leading to lowering the emission efficiency and deterioration in characteristics due to aging. If the barrier layer is too thick, the operating voltage is increased and the emission output is decreased. Therefore, the thickness of the barrier layer is preferably not more than 50 nm.

The repetition of stacking in the multiple quantum well structure is preferably about 3 to about 10 times, more preferably about 3 to about 6 times. The composition and structure can be changed in each well layer and barrier layer.

The n-type layer generally has a thickness of about 1 to about 10 µm, preferably about 2 to about 5 µm. The n-type layer is formed of an n-type contact layer for forming a negative electrode and an n-type cladding layer which has a bandgap larger than that of a light-emitting layer and which is in contact with the light-emitting layer. The n-type contact layer may also serve as the n-type cladding layer. The n-type contact layer is preferably doped with Si or Ge at high concentration. The thus-doped n-type layer preferably has a carrier concentration which is controlled to about $5\times10^{18}$ cm$^{-3}$ to about $2\times10^{19}$ cm$^{-3}$.

The n-type cladding layer may be formed from a semiconductor such as AlGaN, GaN, or InGaN. Needless to say, when InGaN is employed, the InGaN preferably has such a composition as to have a bandgap greater than that of the InGaN forming the light-emitting layer. The carrier concentration of the n-type cladding layer may be equal to or greater or smaller than that of the n-type contact layer. The n-type cladding layer preferably has a surface having high flatness by appropriately regulating growth conditions including growth rate, growth temperature, growth pressure, and dopant concentration, so as to attain high crystallinity of the light-emitting layer formed thereon.

The n-type cladding layer may be formed by alternatingly stacking layers repeatedly, each layer having a different specific composition and lattice constants. In this case, in addition to the composition, the amount of dopant, film thickness, etc. of the layer stacked may be modified.

The p-type layer generally has a thickness of 0.01 to 1 µm and is formed of a p-type cladding layer which is in contact with the light-emitting layer and a p-type contact layer for forming a positive electrode. The p-type cladding layer may also serve as the p-type contact layer. The p-type cladding layer is formed from a semiconductor such as GaN or AlGaN and doped with Mg serving as a p-type dopant. In order to prevent overflow of electrons, the p-type cladding layer is preferably formed from a material having a bandgap greater than that of the material for forming the light-emitting layer. Furthermore, in order to effectively inject carriers into the light-emitting layer, the p-type cladding layer preferably has high carrier concentration.

Similar to the n-type cladding layer, the p-type cladding layer may be formed by alternatingly stacking layers repeatedly, each layer having a different specific composition and lattice constants. In this case, in addition to the composition, the amount of dopant, film thickness, etc. of the layer stacked may be modified.

The p-type contact layer may be formed from a semiconductor such as GaN, AlGaN, or InGaN, and is doped with Mg serving as an impurity element. When removed from a reactor, the as-removed Mg-doped gallium nitride-based compound semiconductor generally exhibits high electric resistance. However, the Mg-doped compound semiconductor exhibits p-type conductivity through activation such as annealing, electron-beam irradiation, or microwave irradiation.

The p-type contact layer may be formed from boron phosphide doped with a p-type impurity element, which exhibits p-type conductivity even though the aforementioned treatment for attaining p-type conductivity is not performed.

No particular limitation is imposed on the method for growing the gallium nitride-based compound semiconductor for forming the aforementioned n-type layer, light-emitting layer, and p-type layer, and any of widely known methods such as MBE, MOCVD, and HVPE may be employed under widely known conditions. Of these, MOCVD is preferred.

Regarding sources for forming the semiconductor, ammonia, hydrazine, an azide, or a similar compound may be used as a nitrogen source. Examples of the Group III organometallic compound include trimethylgallium (TMGa), triethylgallium (TEGa), trimethylindium (TMIn), and trimethylaluminum (TMAl). Examples of employable dopant sources include silane, disilane, germane, organic germanium compound, biscyclopentadienylmagnesium ($Cp_2Mg$), other organometallic compounds, and hydrides. Nitrogen or hydrogen may be employed as a carrier gas.

A well layer having an ununiform thickness is preferably formed by growing a well layer to a predetermined thickness and then decomposing or sublimating a part of the well layer. A gallium nitride-based compound semiconductor containing In can be easily decomposed or sublimated and is preferably used.

The In-containing well layer is preferably grown at a substrate temperature of 650 to 900° C. When the substrate temperature is lower than 650° C., a well layer of high crystallinity cannot be formed, whereas when the substrate temperature is higher than 900° C., the amount of In incorporated into the well layer decreases, thereby not fabricating a light-emitting device which emits light of the intended wavelength.

After the In-containing gallium nitride-based compound semiconductor has been grown to a predetermined thickness by continuously supplying a Group III metal (containing In) source and a nitrogen source, supply of the Group III metal source is stopped. The substrate temperature is maintained or elevated under the above conditions, thereby decomposing or sublimating a portion of the compound semiconductor. The carrier gas is preferably nitrogen. Decomposition or sublimation is preferably performed when the substrate temperature has been elevated from the above growth temperature to 700 to 1,000° C. or while the substrate temperature is elevated.

The barrier layer is preferably grown at a substrate temperature higher than that employed for the growth of the well layer. The substrate temperature is preferably about 700 to about 1,000° C. When the temperature at which the well layer is grown is represented by T1 and the temperature at which the barrier layer is grown is represented by T2, T1 and T2 satisfy the relationship: $T1 \leq T2$. During increasing temperature after growth of the well layer from T1 to T2, supply of the Group III source is stopped while the nitrogen source and a nitrogen-containing carrier gas are supplied continuously, whereby a thick part and a thin part are effectively formed in the well layer and as a result, a well layer having an ununiform thickness is formed. During the course of the above procedure, change of carrier gas is not needed. If the carrier gas is changed to hydrogen, the wavelength of emitted light is blue-shifted. As such variation in wavelength is difficult to control reliably, the variation reduces device productivity.

The rate of increasing temperature from T1 to T2 is preferably about 1 to about 200° C./min, more preferably about 5 to about 150° C./min. The time required for increasing temperature from T1 to T2 is preferably about 30 sec to about 10 min, more preferably about 1 min to about 5 min.

The growth of the barrier layer may include a plurality of steps which are performed at different growth temperatures. For example, a barrier layer having a predetermined thickness is formed at T2 on a well layer, followed by forming thereon another barrier layer at a growth temperature T3. When T3 is lower than T2, deterioration of characteristics caused by aging can be prevented, which is preferred. T3 may be equal to T1.

Further, as described above, when a well layer contains In, a thin layer containing no In is preferably provided on the substrate side of the barrier layer. In that case, a well layer comprising a gallium nitride-based compound semiconductor containing In is grown at the temperature T1 and then only the supply of a In source stops at the same substrate temperature to grow the barrier layer comprising a gallium nitride-based compound semiconductor at the temperature T1 first.

Negative electrodes of a variety of compositions and structures have been widely known, and no particular limitation is imposed on the negative electrode which may be employed in the present invention. Examples of employable contact materials for the negative electrode which is to be in contact with an n-type contact layer include Al, Ti, Ni, Au, Cr, W, and V. Needless to say, the negative electrode may have a multilayer structure in its entirety, thereby imparting the electrode with a bonding property and other properties.

Positive electrodes of a variety of compositions and structures have been widely known, and no particular limitation is imposed on the positive electrode which may be employed in the present invention.

Examples of light-permeable positive electrode materials include Pt, Pd, Au, Cr, Ni, Cu, and Co. Through partial oxidation of the positive electrode, light permeability is known to be enhanced. Examples of employable reflection-type positive electrode materials include the aforementioned materials, Rh, Ag, and Al.

The positive electrode may be formed through a method such as sputtering or vacuum vapor deposition. Particularly when sputtering is employed under appropriately controlled sputtering conditions, ohmic contact can be established even though the electrode film is not annealed after formation of the film, which is preferred.

The light-emitting device may have a flip-chip-type structure including a reflection-type positive electrode or a face-up-type structure including an light-permeable positive electrode or a lattice-like or comb-like positive electrode.

According to a well layer having an ununiform thickness which includes a thick part and a thin part, an interface between the well layer and a barrier layer composed of a material different from that of the well layer in a boundary area between the thick part and the thin part is slanted to the substrate surface. Therefore, the amount of light extracted in the direction normal to the substrate surface increases. Particularly when the light-emitting device has a flip-chip-type structure including a reflection-type electrode, emission intensity is further enhanced.

An operating voltage of a light-emitting device obtained by using the inventive gallium nitride-based compound semiconductor multilayer structure may be freely lowered to some degree. However, when it is largely lowered, the emission output is also lowered. The operating voltage, at which the emission output is not lowered, is 2.5 V or more at a current of 20 mA. More preferably, the operating voltage is 2.9 V or more. It is necessary that the operating voltage is 3.5 V or less, because a very high operating voltage is disadvantageous when a light-emitting device is incorporated in equipment.

A take-off voltage, at which a current increases rapidly in a current-voltage curve, is a diode characteristic. The take-off voltage of a light-emitting device obtained by using the inventive gallium nitride-based compound semiconductor multilayer structure may be lowered. However, in regard to the take-off voltage, when it is lowered very largely, a emission output is also lowered together. The take-off voltage, at which the emission output is not lowered, is 2.3 V or more at a current of 20 mA. More preferably, the take-off voltage is 2.5 V or more. It is necessary that the take-off voltage is 3.4 V or less, because a very high take-off voltage is disadvantageous when a light-emitting device is incorporated in equipment.

The inventive gallium nitride-based compound semiconductor multilayer structure is employed in, for example, a light-emitting diode (LED) and a laser diode (LD).

A semiconductor light-emitting device is fabricated from the inventive gallium nitride-based compound semiconductor multilayer structure and, through conventional means well known in the art, a transparent cover was attached to the semiconductor light-emitting device, thereby fabricating a lamp. Also, a phosphor-containing cover was attached to the semiconductor light-emitting device, thereby fabricating a white light lamp.

A semiconductor light-emitting device having a high emission output may be fabricated from the inventive gallium nitride-based compound semiconductor multilayer structure. A very bright LED lamp may be fabricated from the inventive gallium nitride-based compound semiconductor multilayer structure by the above-mentioned technique. Further, an electronic machine such as a portable telephone, a display and an instrument panel, in which a chip fabricated by the above-mentioned technique is incorporated, and machines such as a car, a computer and a game machine, in which the electronic machine is incorporated, may be operated at low electric power and may attain a high performance. Specially, apparatuses such as a portable telephone, a game machine and a car part, which are operated by a battery, may attain the effect of saving energy.

EXAMPLES

The present invention will next be described in more detail by way of examples, which should not be construed as limiting the invention.

Example 1

FIG. 1 schematically shows a gallium nitride-based compound semiconductor multilayer structure for producing a semiconductor light-emitting device which structure was fabricated as Example 1 (configuration of well layers and barrier layers in the light-emitting layer being omitted). As shown in FIG. 1, an SP layer formed of AlN is stacked on a sapphire substrate having a c-plane through a lattice-mismatch crystal epitaxial growth method. On the SP layer, the following layers are sequentially formed: an undoped GaN undercoat layer (thickness: 8 μm); a highly-Ge-doped GaN contact layer (electron concentration: $1\times10^{19}$ cm$^{-3}$, thickness: 2 μm); an Si-doped $In_{0.02}Ga_{0.98}N$ cladding layer (electron concentration: $1\times10^{18}$ cm$^{-3}$, thickness: 20 nm); a light-emitting layer of a multiple quantum well structure including 6 Si-doped GaN barrier layers (electron concentration: $3\times10^{17}$ cm$^{-3}$, thickness of each layer: 15 nm) and 5 undoped $In_{0.08}Ga_{0.92}N$ well layers (thickness of each layer: 3 nm); an Mg-doped p-type $Al_{0.05}Ga_{0.95}N$ cladding layer (thickness: 16 nm); and an Mg-doped p-type $Al_{0.02}Ga_{0.98}N$ contact layer (hole concentration: $8\times10^{17}$ cm$^{-3}$, thickness: 0.2 μm).

The aforementioned gallium nitride-based compound semiconductor multilayer structure was fabricated by means of MOCVD through the following procedure.

Firstly, a sapphire substrate was placed in a stainless reactor furnace that can heat a plurality of substrates by means of a carbon susceptor heated by an induction heater. The susceptor has a mechanism such that the susceptor itself is rotatable and it rotates the substrates. The sapphire substrate was placed on the carbon susceptor for heating, the operation being performed in a nitrogen-substituted glove box. After introduction of the substrate, the reactor furnace was purged with nitrogen.

After passage of nitrogen for 8 minutes, the substrate temperature was elevated, over 10 minutes, to 600° C. by means of the induction heater, and the pressure inside the furnace was adjusted to 15 kPa (150 mbar). While the substrate temperature was maintained at 600° C., the substrate surface was thermally cleaned by allowing the substrate to stand for 2 minutes under flow of hydrogen and nitrogen.

After completion of thermal cleaning, a valve of a nitrogen carrier gas feeding pipe was closed, and only hydrogen was supplied to the reactor furnace.

After the carrier gas was changed to hydrogen, the substrate temperature was elevated to 1,150° C. After confirming that a constant temperature of 1,150° C. was attained, a gas containing TMAl vapor was supplied to the reactor furnace by opening the corresponding valve. The supplied TMAl was caused to react with N atoms which had been released through decomposition of deposits on an inner wall of the reactor furnace, thereby depositing AlN on the sapphire substrate.

After supply of TMAl for 7 minutes and 30 seconds, the valve was closed to stop supply of the gas containing TMAl vapor to the reactor furnace. The conditions were maintained for 4 minutes, whereby the TMAl vapor remaining in the furnace was completely removed. Subsequently, ammonia gas was supplied to the furnace by opening the corresponding valve.

Four minutes after the start of supply of ammonia gas, the susceptor temperature was lowered to 1,040° C. under ammonia flow and simultaneously the pressure inside the furnace was adjusted to 40 kPa (400 mbar). During lowering of the susceptor temperature, the flow rate of TMGa was regulated by means of a flow controller.

After confirmation that the substrate temperature was lowered to 1,040° C. and the substrate maintained a constant temperature of 1,040° C., TMGa was supplied into the furnace by opening the corresponding valve, so as to grow undoped GaN. The growth was performed for about 4 hours, thereby forming the aforementioned GaN layer.

Thus, an undoped GaN undercoat layer having a thickness of about 8 μm was formed.

Additionally, a highly Ge-doped n-type GaN contact layer was grown on the undoped GaN undercoat layer. After the growth of the undoped GaN undercoat layer, the supply of TMGa into the furnace was stopped, the substrate temperature was increased to 1080° C. in one minutes, and the temperature was kept for three minutes to stabilize the same. During the process, the flow rate of TMGe was controlled. The flow rate was determined in advance and was controlled so that the electron concentration of the Ge-doped GaN contact layer was about $2\times10^{19}$ cm$^{-3}$. Ammonia was continuously supplied into the furnace at the same flow rate.

After stabilizing the temperature for three minutes, a Ge-doped n-type GaN having the thickness of 10 nm and an undoped GaN having the thickness of 10 nm were grown alternately in this order for 100 periods to grow a n-type GaN contact layer of about 2 μm. The Ge-doped GaN layer was produced by supplying TMGa and tetramethylgermanium (TMGe) into the furnace. The undoped GaN layer was produced by supplying TMGa. Thus, an n-type GaN contact layer having an average carrier concentration of about $1\times10^{19}$ cm$^{-3}$.

After the growth of the last undoped GaN layer, the supply of TMGa into the furnace was stopped by switching the TMGa valve. The carrier gas was changed from hydrogen to nitrogen by switching the valve while ammonia was continuously introduced. Then, the temperature of the substrate was lowered from 1080° C. to 720° C.

During the lowering of the temperature inside the furnace, the flow rate of SiH$_4$ was modified. The flow rate of interest had been predetermined in advance, and the flow was regulated so as to control the electron concentration of the Si-doped InGaN cladding layer to $1\times10^{18}$ cm$^{-3}$. Ammonia was supplied continuously into the furnace, but the flow rate was unchanged.

Then, after the condition in the furnace was stabilized, the valves for TMIn, TEGa and SiH$_4$ were switched at the same time to start supplying the materials into the furnace. The materials were continuously supplied for predetermined time to form a Si-doped In$_{0.02}$Ga$_{0.98}$N clad layer having a thickness of 20 nm. After that, the valves for TMIn, TEGa and SiH$_4$ were switched to stop supplying the materials. Then, the setting for the supplying amount of SiH$_4$ was changed. The flow rate was determined in advance and was controlled so that the electron concentration of the Si-doped GaN barrier layer was $3\times10^{17}$ cm$^{-3}$. The Si-doped GaN barrier layer was formed as follows.

TEGa and SiH$_4$ were begun to be supplied into the furnace while keeping the substrate temperature at 720° C., a thin barrier layer A comprising a Si-doped GaN was formed for predetermined time, and the supply of TEGa and SiH$_4$ was stopped. Then, the substrate temperature was increased to 920° C. while the growth stopped. After the temperature was stabilized, TEGa and SiH$_4$ were begun to be supplied into the furnace by switching the valves for TEGa and SiH$_4$ while the pressure in the furnace and the flow rates and kinds of ammonia gas and of the carrier gas were maintained. A barrier layer B was grown at the substrate temperature of 920° C. for predetermined time. After that, the substrate temperature was decreased to 720° C. and TEGa and SiH$_4$ were continuously supplied to grow a barrier layer C. Then, the supply of TEGa and SiH$_4$ was stopped by switching valves again to finish the growth of the GaN barrier layer. Thus, the Si-doped GaN barrier layer comprising a three-layered structure of A, B and C, and having a total thickness of 15 nm was formed.

After the growth of the GaN barrier layer, the supply of TEGa and SiH$_4$ stopped for 30 seconds. Then, TEGa and TMIn were started to be supplied into the furnace by switching the valves for TEGa and TMIn while the pressure in the furnace and the flow rates and kinds of ammonia gas and of the carrier gas were maintained to form a well layer. After supplying TEGa and TMIn for predetermined time, only the supply of TMIn was stopped by switching the valve again to finish the growth of the In$_{0.08}$Ga$_{0.92}$N well layer. At that moment, the In$_{0.08}$Ga$_{0.92}$N well layer having a thickness of 3 nm was formed. After that, SiH$_4$ was supplied to form a second barrier layer.

The above described processes were repeated 5 times to form five Si-doped GaN barrier layers and five In$_{0.08}$Ga$_{0.92}$N well layers. In the manufacturing processes of the well layers and the barrier layers, after the barrier layer A was formed at 720° C., the growth of the semiconductor layer was stopped by stopping the supply of a III group material during the heating process to 920° C., in order to form the barrier layer B.

After the fifth In$_{0.08}$Ga$_{0.92}$N well layer was formed, the process for producing the sixth barrier layer started. In the production of the sixth barrier layer, SiH$_4$ was again supplied. After the thin barrier layer A comprising a Si-doped GaN was formed, the substrate temperature was increased to 920° C. while TEGa and SiH$_4$ were continuously supplied into the furnace. The barrier layer B was grown at the substrate temperature of 920° C. for predetermined time. Then, the substrate temperature was decreased to 720° C. and TEGa and SiH$_4$ were continuously supplied to grow the barrier layer C. After that, the supply of TEGa and SiH$_4$ was stopped by switching the valves again to finish the growth of the GaN barrier layer. Thus, the Si-doped GaN barrier layer comprising a three-layered structure of A, B and C, and having a total thickness of 15 nm was formed.

According to the above described method, a light-emitting layer of a multiple quantum well structure containing well layers (the first to fourth layers) having ununiform thicknesses and a well layer having an uniform thickness (the fifth layer) was formed.

On the outermost Si-doped GaN barrier layer of the light-emitting layer, an Mg-doped p-type Al$_{0.05}$Ga$_{0.95}$N cladding layer was formed.

After completion of the growth of the last Si-doped GaN barrier layer, by stopping the supply of TEGa and SiH$_4$, the substrate temperature was elevated to 1,000° C. The carrier gas was changed to hydrogen, and the pressure inside the furnace was adjusted to 15 kPa (150 mbar). After the pressure inside the furnace became constant, sources (TMGa, TMAl, and Cp$_2$Mg) were supplied to the furnace by opening the corresponding valves. The growth was performed for about three minutes, after which supply of TEGa, TMAl and Cp$_2$Mg was stopped, thereby terminating the growth of an Mg-doped p-type Al$_{0.05}$Ga$_{0.95}$N cladding layer. As a result, an Mg-doped p-type Al$_{0.05}$Ga$_{0.95}$ cladding layer having a thickness of 16 nm was formed.

On the Mg-doped p-type Al$_{0.05}$Ga$_{0.95}$N cladding layer, an Mg-doped p-type GaN contact layer was formed.

After completion of the growth of the Mg-doped Al$_{0.05}$Ga$_{0.95}$N cladding layer by stopping supply of TMGa, TMAl, and Cp$_2$Mg, the pressure inside the furnace was adjusted to 20 kPa (200 mbar). After the pressure inside the furnace became constant, sources (TMGa, TMAl and Cp$_2$Mg) were supplied to the furnace by opening the corresponding valves. The flow rate of Cp$_2$Mg had been predetermined in advance, and the flow was regulated so as to control the hole concentration of the Mg-doped Al$_{0.02}$Ga$_{0.98}$N contact layer to $8\times10^{17}$ cm$^{-3}$. Thereafter, the growth was performed for about 12 minutes, after which supply of TMGa, TMAl and Cp$_2$Mg was stopped, thereby terminating the growth of the Mg-doped GaN layer. As a result, the Mg-doped Al$_{0.02}$Ga$_{0.98}$N contact layer was formed to a thickness of 0.2 μm.

After completion of the growth of the Mg-doped $Al_{0.02}Ga_{0.98}N$ contact layer, the electricity supply to the induction heater was stopped, and the substrate temperature was lowered to room temperature over 20 minutes. During the process of lowering the temperature, the atmosphere in the reactor furnace was formed exclusively of nitrogen. When the substrate temperature was confirmed to have been lowered to room temperature, the thus-fabricated gallium nitride-based compound semiconductor multilayer structure was removed to the atmosphere.

Through the above-described procedure, the gallium nitride-based compound semiconductor multilayer structure for producing a semiconductor light-emitting device was fabricated. Even though the Mg-doped $Al_{0.02}Ga_{0.98}N$ layer had not undergone annealing for activating the p-type carrier, the $Al_{0.02}Ga_{0.98}N$ layer exhibited p-type conductivity.

By use of the aforementioned gallium nitride-based compound semiconductor multilayer structure, a light-emitting diode, which is a type of semiconductor light-emitting device, was fabricated.

On the surface of the p-type AlGaN contact layer of the thus-fabricated gallium nitride-based compound semiconductor multilayer structure, there was formed a reflection-type positive electrode having a structure in which Pt, Rh, and Au were successively formed on the contact layer side through a method well-known in the art.

Figure 2:
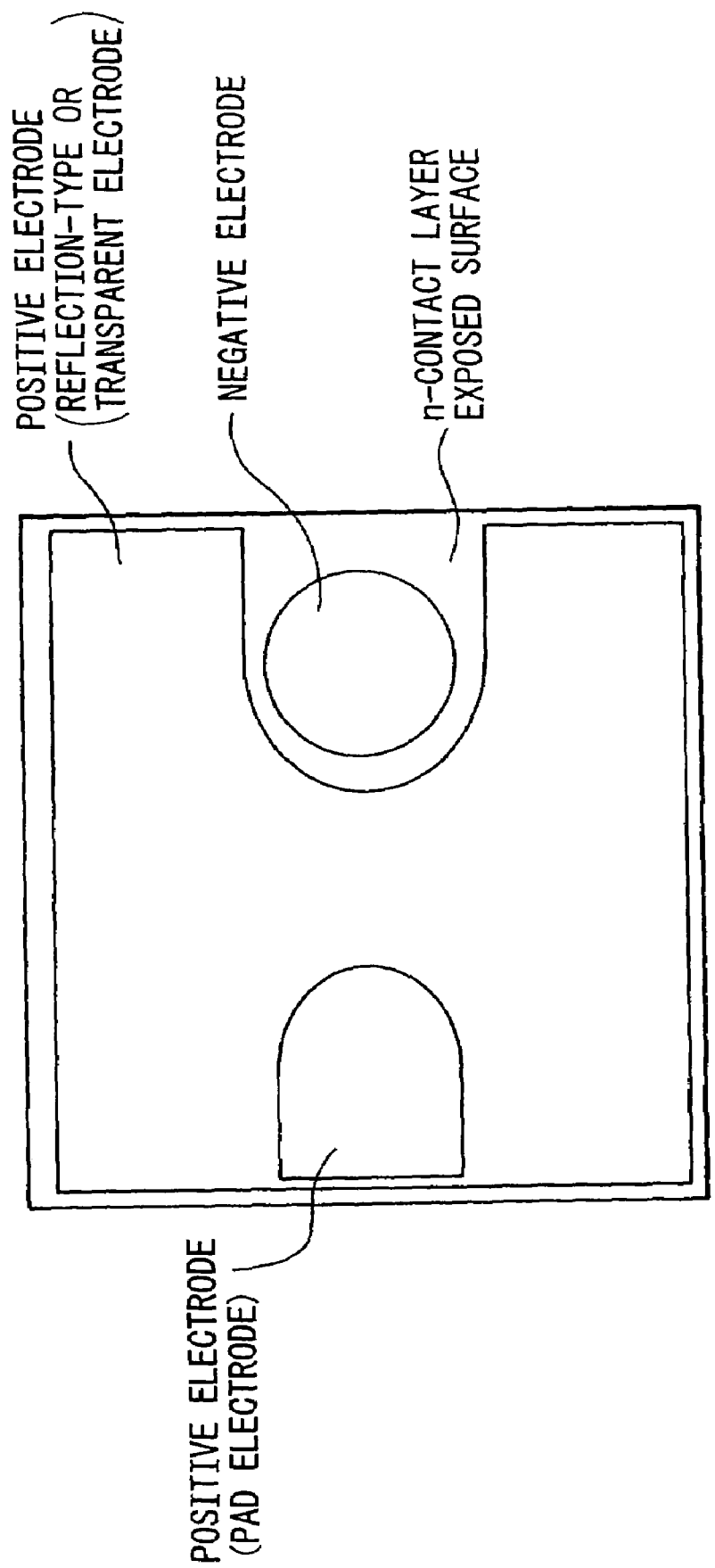
FIG. 2 is a schematic view of an electrode configuration of the light-emitting diode fabricated in Example and Comparative Example.
Figure 3:
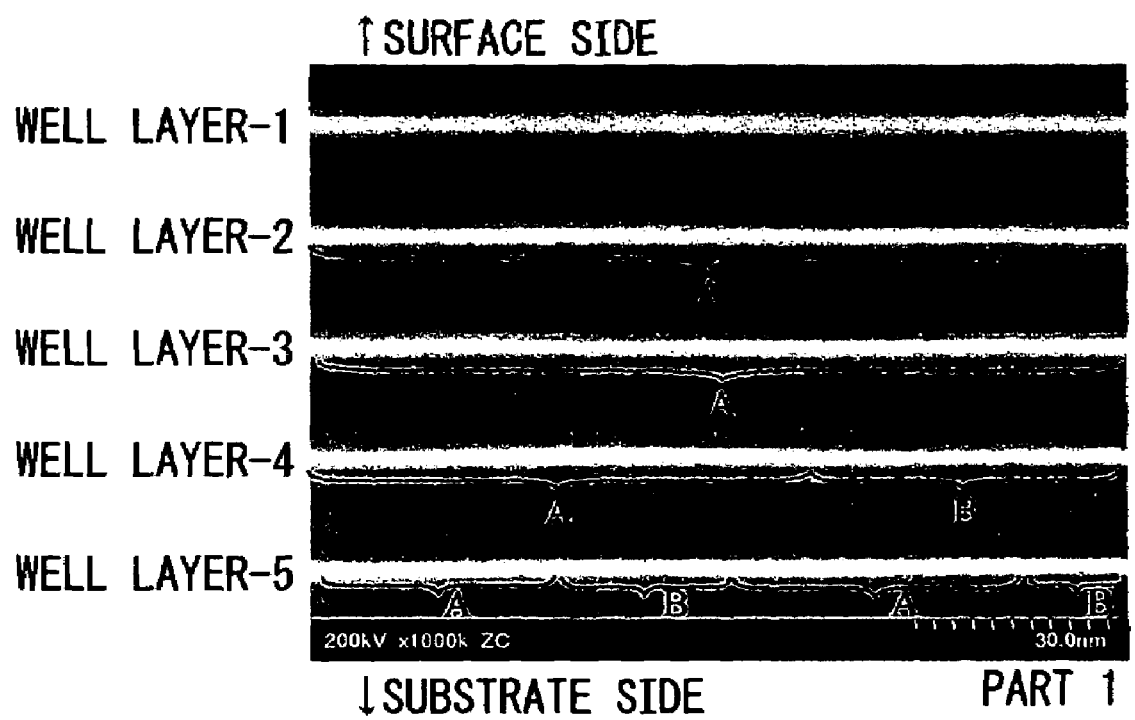
FIG. 3 is an exemplary cross-section TEM photograph of the gallium nitride-based compound semiconductor multilayer structure fabricated in Example 1.
Figure 4:
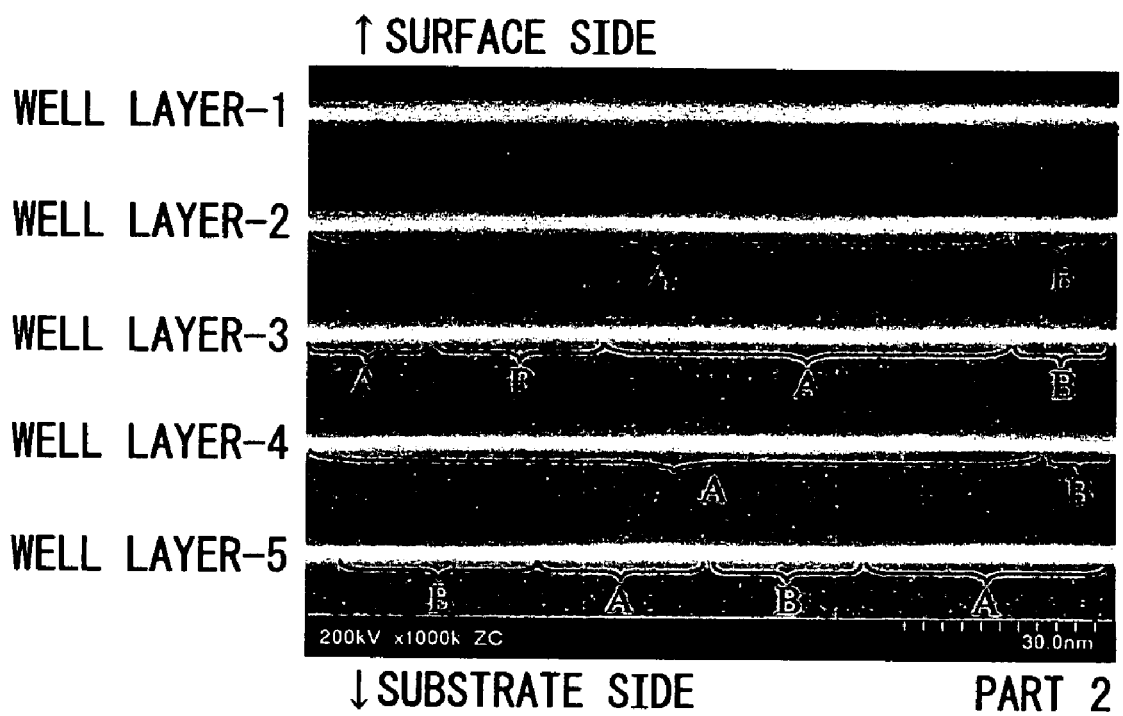
FIG. 4 is another exemplary cross-section TEM photograph of the gallium nitride-based compound semiconductor multilayer structure fabricated in Example 1.
Figure 5:
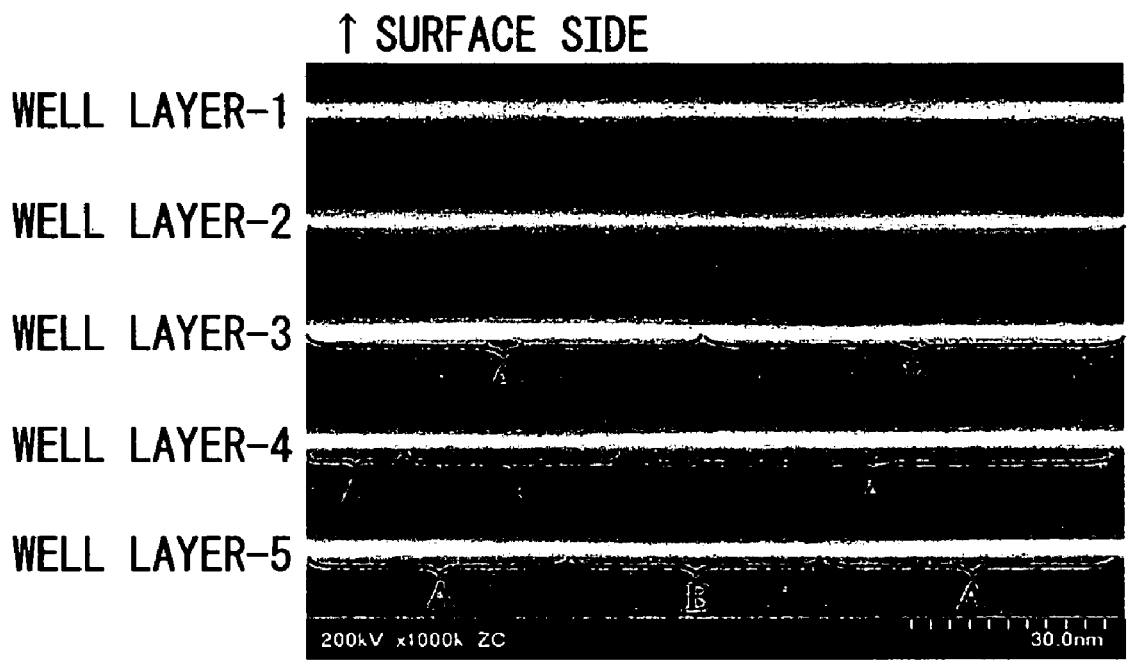
FIG. 5 is another exemplary cross-section TEM photograph of the gallium nitride-based compound semiconductor multilayer structure fabricated in Example 1.
Figure 6:
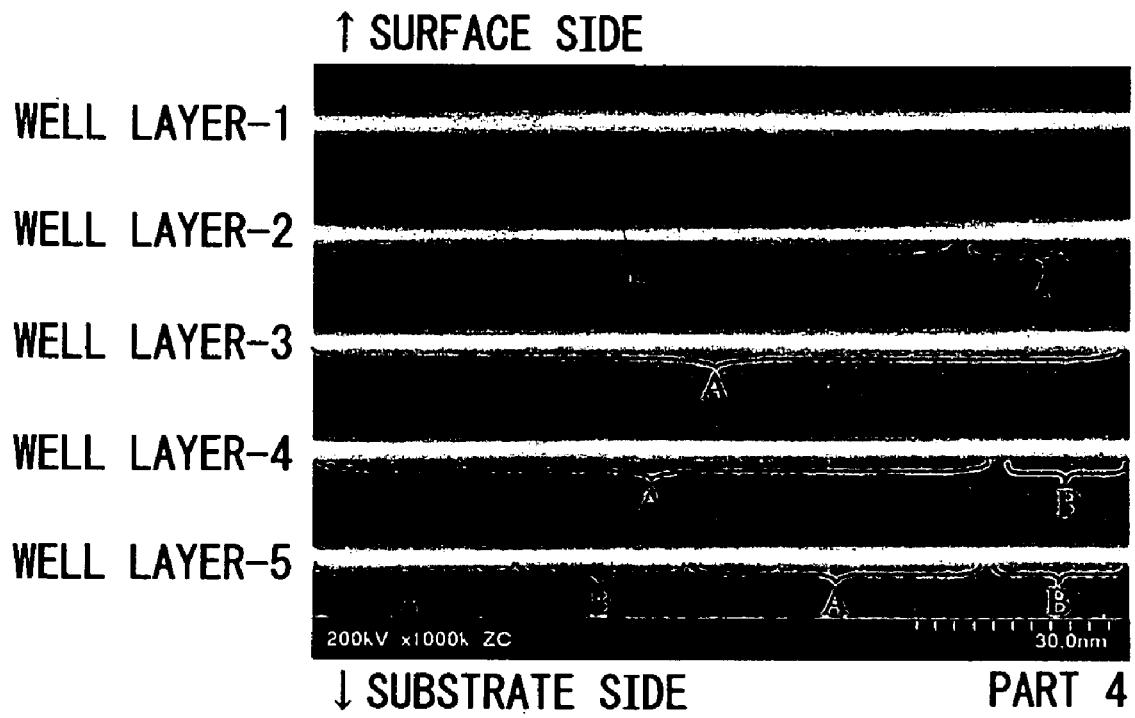
FIG. 6 is another exemplary cross-section TEM photograph of the gallium nitride-based compound semiconductor multilayer structure fabricated in Example 1.
Figure 7:
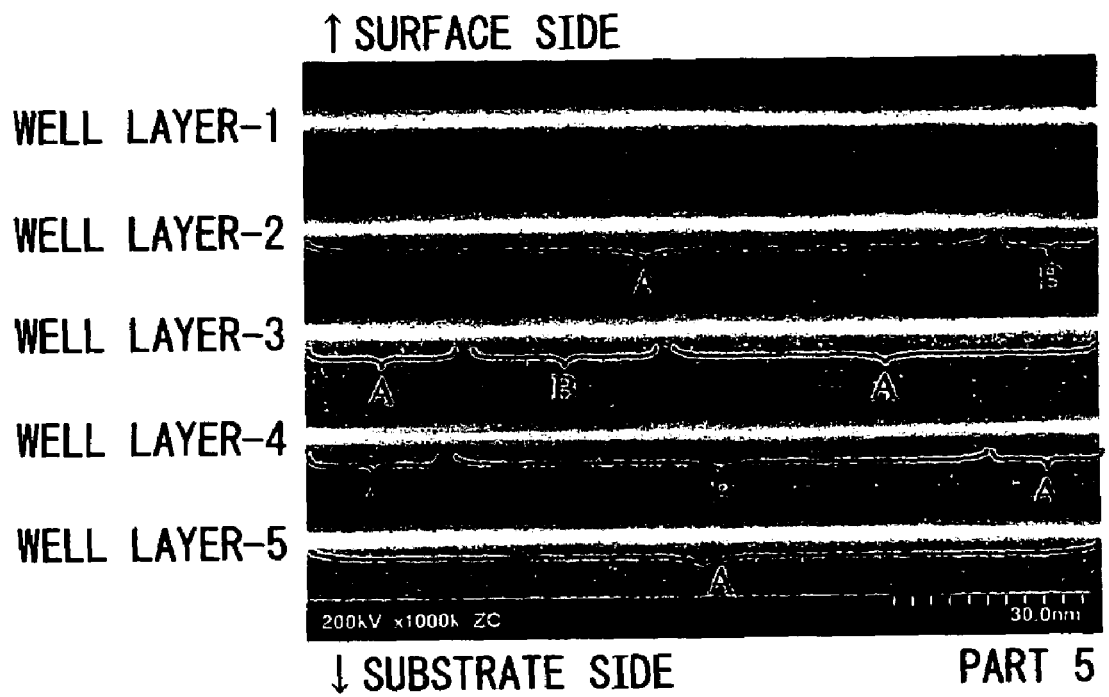
FIG. 7 is another exemplary cross-section TEM photograph of the gallium nitride-based compound semiconductor multilayer structure fabricated in Example 1.
Figure 8:
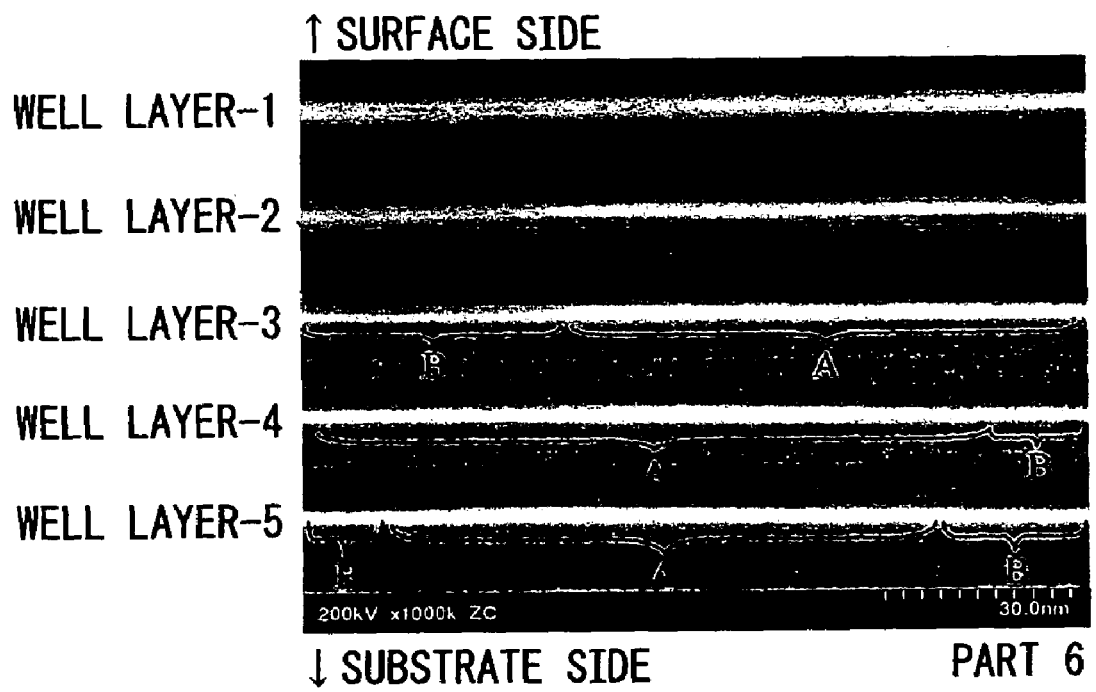
FIG. 8 is another exemplary cross-section TEM photograph of the gallium nitride-based compound semiconductor multilayer structure fabricated in Example 1.
Figure 9:
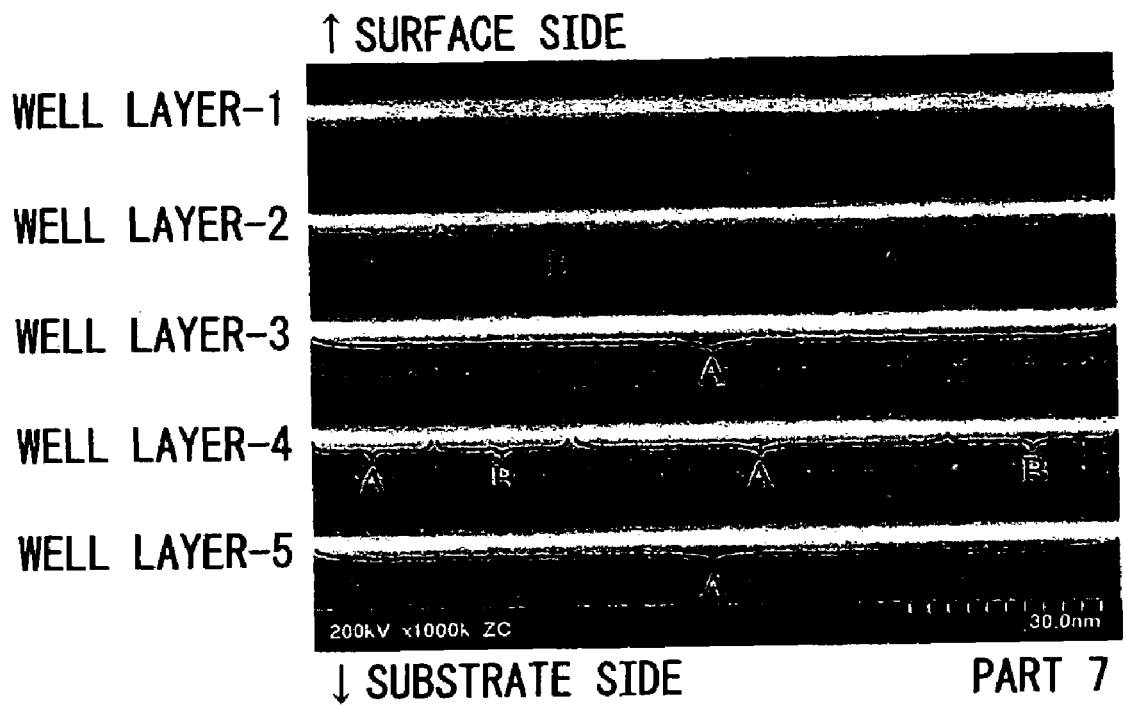
FIG. 9 is another exemplary cross-section TEM photograph of the gallium nitride-based compound semiconductor multilayer structure fabricated in Example 1.
Figure 10:
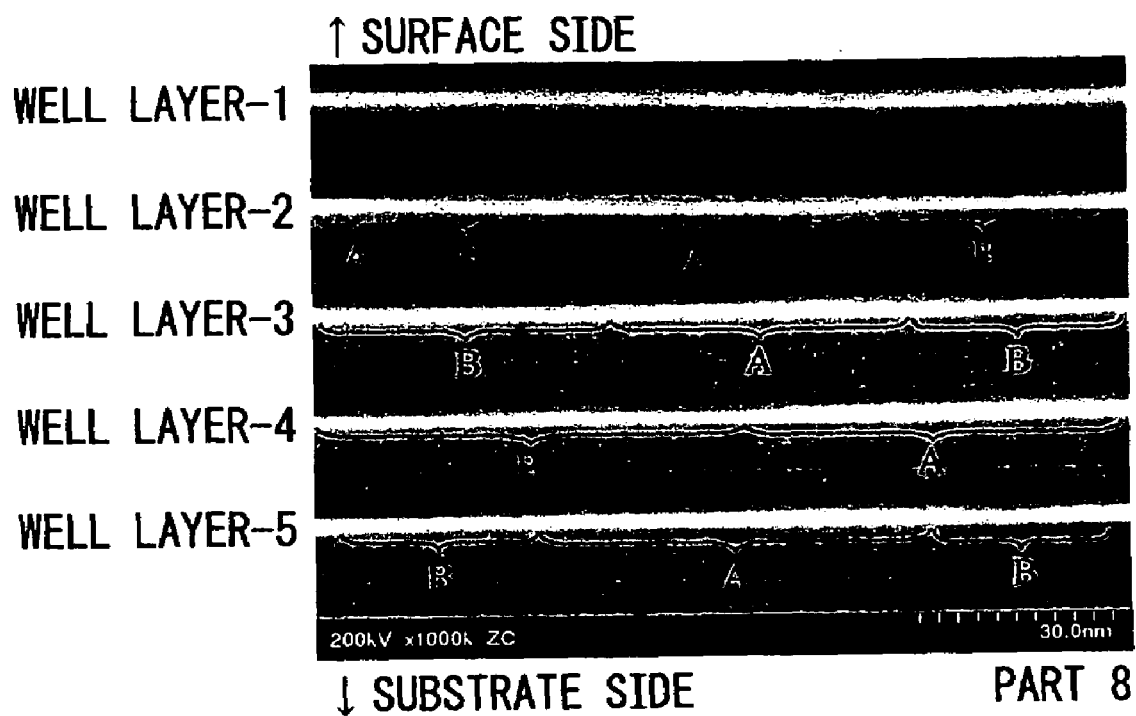
FIG. 10 is another exemplary cross-section TEM photograph of the gallium nitride-based compound semiconductor multilayer structure fabricated in Example 1.

Subsequently, the aforementioned gallium nitride-based compound semiconductor multilayer structure was dry-etched so as to expose a negative electrode portion of the highly-Ge-doped n-type GaN contact layer. Ti and Al were successively formed on the exposed portion of the contact layer in this order, thereby forming a negative electrode. Through these operations, electrodes of the shape shown in FIG. 2 were fabricated.

The back of the sapphire substrate of the gallium nitride-based compound semiconductor multilayer structure which had been provided with the positive electrode and the negative electrode in the above manner was ground and polished, thereby providing a mirror surface. Subsequently, the gallium nitride-based compound semiconductor multilayer structure was cut into square (350 μm×350 μm) chips, and each chip was affixed on a sub-mount such that the electrodes were in contact with the sub-mount. The thus-formed sub-mounted chip was placed on a lead frame and wired to the lead frame with gold wire, thereby fabricating a light-emitting device.

When an operating current was applied to the positive electrode and the negative electrode of the thus-fabricated light-emitting diode in a forward direction, the diode exhibited a forward voltage (an operating voltage) of 3.2 V at a current of 20 mA, an emission wavelength of 460 nm, and an emission output of 10.8 mW. Such characteristics of the light-emitting diode can be attained without variation among light-emitting diodes cut and produced from virtually the entirety of the above-fabricated gallium nitride-based compound semiconductor multilayer structure.

Also, the reverse voltages at the current of 10 μA before and after the power supply at the current of 30 mA and for 100 hours were measured and compared with each other. The changing rate of the reverse voltages was 0%.

FIGS. 3 to 10 show examples of photographs observed at 1,000,000 magnifications by a cross-sectional TEM. Eight parts spaced at 20 μm distance from each other in a cross section were observed. The serial numbers for the well layers are assigned 1 to 5 from the surface side (the semiconductor side) of the nitride semiconductor multilayer structure. Thus, the well layer 1 is located on the p-type layer side and the well layer 5 is located on the n-type layer side. In the figures, A represents a thick part and B represents a thin part. Tables, attached to FIGS. 3 to 10, show the maximum thickness and the minimum thickness of each well layer at the respective parts.

Considering the eight parts shown in FIGS. 3 to 10, the maximum thickness, the minimum thickness, the average thickness, and the ratio of the difference between the maximum thickness and the average thickness to the average thickness (the ratio of the difference between minimum thickness and the average thickness to the average thickness) were calculated and shown in Table 1.

TABLE 1

| Well layer | Maximum thickness (nm) | Minimum thickness (nm) | Average thickness (nm) | Ratio of difference |
|---|---|---|---|---|
| 1 | 3.1 | 2.8 | 2.95 | ±5.1% |
| 2 | 3.2 | 1.8 | 2.50 | ±28.0% |
| 3 | 3.1 | 1.9 | 2.50 | ±24.0% |
| 4 | 3.1 | 1.6 | 2.35 | ±31.9% |
| 5 | 3.2 | 1.7 | 2.45 | ±30.6% |

From Table 1, it can be seen that the range of the thicknesses of the well layer 1 from its average thickness is ±5.1% and is in the range of 10%, and that the layer is a well layer having a uniform thickness in the present invention. It can also be seen that the ranges of the thicknesses of the well layers 2 to 5 from their average thicknesses are ±28.0%, ±24.0%, ±31.9% and ±30.6%, respectively, and are more than 10%, and that the layers are well layers having ununiform thicknesses in the present invention. In each of the well layers 2 to 5, a part having a thickness larger than its average thickness is a thick part and a part having a thickness smaller than its average thickness is a thin part.

From FIGS. 3 to 10, the thickness of the barrier layer was about 15 nm. The barrier layer completely filled the gab between the thicknesses of the thin part and the thick part of the well layer.

FIGS. 11 to 18 are TEM photographs in which the neighborhoods of the parts in FIGS. 3 to 10 was observed at 200,000 magnifications. In these figures, it can be seen that the well layer 1 has a uniform thickness.

From these TEM photographs, the widths of the thick parts and of the thin parts of the well layers 2 to 5 were measured and the distributions of the same were evaluated. The thick or thin part of each well layer was determined based on the average thickness of each well layer calculated from FIGS. 3 to 10. The results are shown in Table 2. For example, in the well layer 2 in the TEM photograph of FIG. 11, the widths were, in this order from the left side of the field of view in the TEM photograph, 250 nm in the thick part, 60 nm in the thin part, 105 nm in the thick part, 35 nm in the thin part, and 75 nm in the thick part. In Table 2, the thicknesses are described as thick part (250 nm)—thin part (60 nm)—thick part (105 nm)—thin part (35 nm)—thick part (75 nm).

TABLE 2

Figure 11:
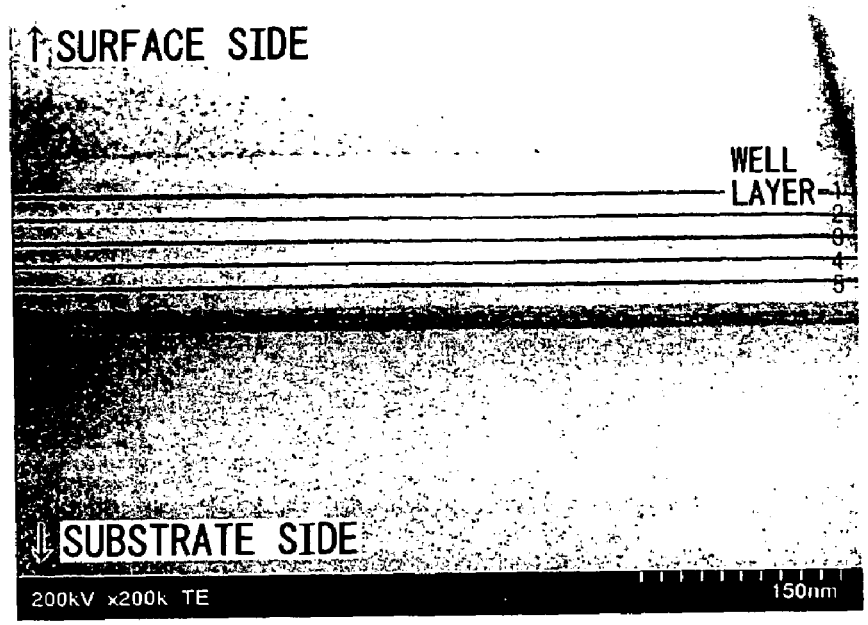
FIG. 11 is another exemplary cross-section TEM photograph of the gallium nitride-based compound semiconductor multilayer structure fabricated in Example 1.
Figure 12:
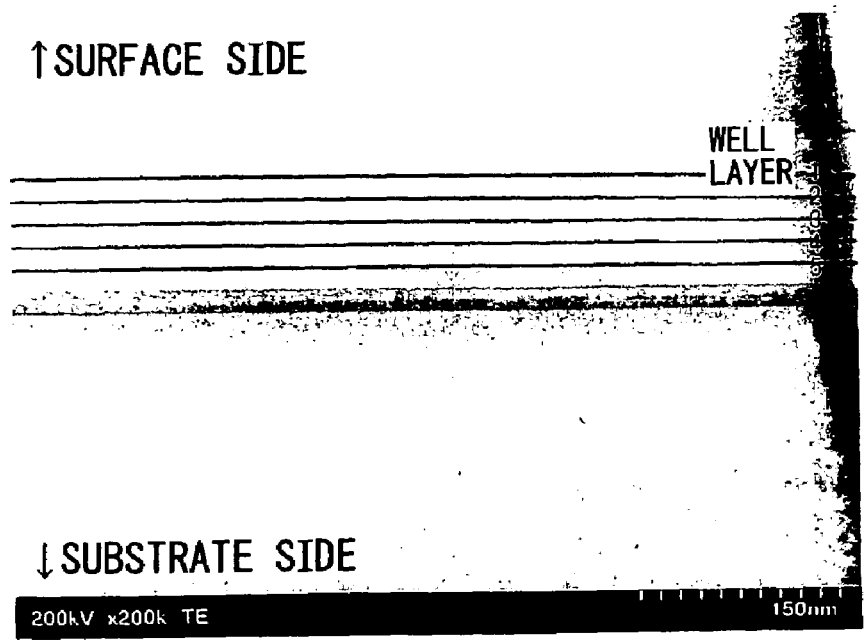
FIG. 12 is another exemplary cross-section TEM photograph of the gallium nitride-based compound semiconductor multilayer structure fabricated in Example 1.
Figure 13:
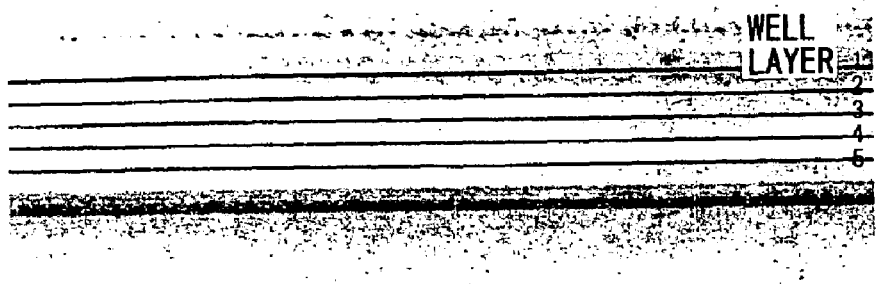
FIG. 13 is another exemplary cross-section TEM photograph of the gallium nitride-based compound semiconductor multilayer structure fabricated in Example 1.
Figure 14:
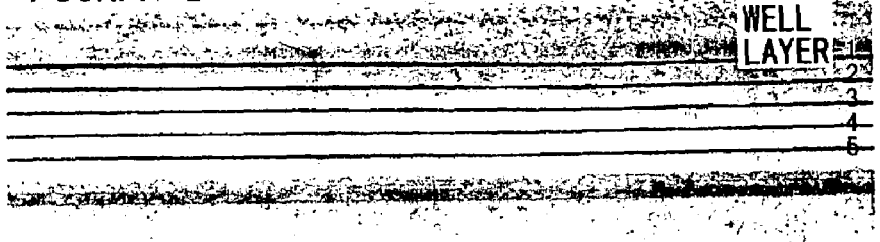
FIG. 14 is another exemplary cross-section TEM photograph of the gallium nitride-based compound semiconductor multilayer structure fabricated in Example 1.
Figure 15:
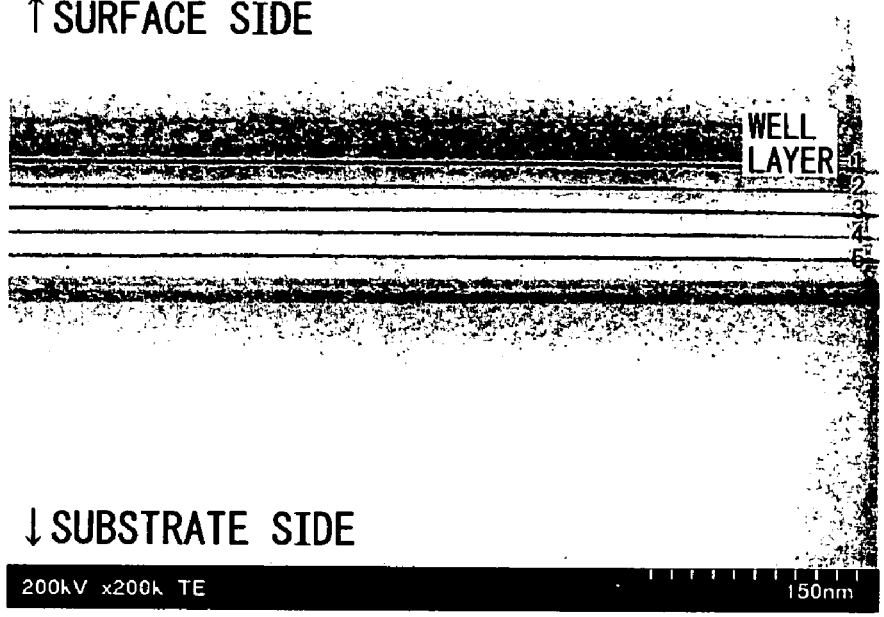
FIG. 15 is another exemplary cross-section TEM photograph of the gallium nitride-based compound semiconductor multilayer structure fabricated in Example 1.
Figure 16:
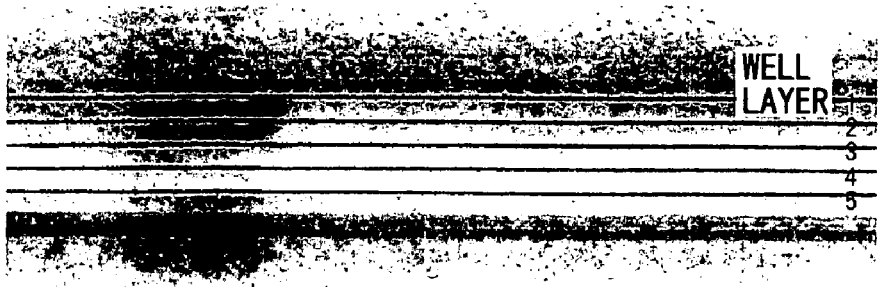
FIG. 16 is another exemplary cross-section TEM photograph of the gallium nitride-based compound semiconductor multilayer structure fabricated in Example 1.

| TEM photograph | Well layer | Distribution of thick part and thin part | Variation Thin part | Variation Thick part |
|---|---|---|---|---|
| FIG. 11 | 2 | Thick part (250 nm)-thin part (60 nm)-thick part (105 nm)-thin part (35 nm)-thick part (75 nm) | 35-60 nm | 75-250 nm |
|  | 3 | Thick part (260 nm)-thin part (45 nm)-thick part (220 nm) | 45 nm | 220-260 nm |
|  | 4 | Thick part (160 nm)-thin part (100 nm)-thick part (220 nm) | 100 nm | 160-220 nm |
|  | 5 | Thick part (260 nm)-thin part (70 nm)-thick part (120 nm) | 70 nm | 120-260 nm |
| FIG. 12 | 2 | Thick part (410 nm)-thin part (35 nm)-thick part (50 nm)-thin part (30 nm) | 30-35 nm | 50-410 nm |
|  | 3 | Thick part (470 nm)-thin part (30 nm) | 30 nm | 470 nm |
|  | 4 | Thick part (185 nm)-thin part (40 nm)-thick part (235 nm)-thin part (80 nm) | 40-80 nm | 185-235 nm |
|  | 5 | Thick part (145 nm)-thin part (50 nm)-thick part (245 nm)-thin part (40 nm) | 40-50 nm | 145-245 nm |
| FIG. 13 | 2 | Thick part (270 nm)-thin part (65 nm)-thick part (20 nm)-thin part (55 nm) | 55-65 nm | 20-270 nm |
|  | 3 | Thick part (320 nm)-thin part (80 nm)-thick part (70 nm)-thin part (50 nm) | 50-80 nm | 70-320 nm |
|  | 4 | Thick part (270 nm)-thin part (90 nm)-thick part (120 nm)-thin part (30 nm) | 30-90 nm | 120-270 nm |
|  | 5 | Thick part (310 nm)-thin part (40 nm)-thick part (200 nm) | 40 nm | 200-310 nm |
| FIG. 14 | 2 | Thick part (190 nm)-thin part (60 nm)-thick part (120 nm)-thin part (60 nm)-thick part (75 nm) | 60 nm | 75-190 nm |
|  | 3 | Thick part (320 nm)-thin part (40 nm)-thick part (60 nm)-thin part (60 nm) | 40-60 nm | 60-320 nm |
|  | 4 | Thin part (60 nm)-thick part (65 nm)-thin part (90 nm)-thick part (140 nm)-thin part (55 nm) | 55-90 nm | 65-140 nm |
|  | 5 | Thick part (300 nm)-thin part (45 nm)-thick part (65 nm)-thin part (60 nm) | 45-60 nm | 65-300 nm |
| FIG. 15 | 2 | Thick part (450 nm)-thin part (50 nm)-thick part (40 nm)-thin part (35 nm) | 35-50 nm | 40-450 nm |
|  | 3 | Thick part (580 nm) | — | 580 nm |
|  | 4 | Thick part (520 nm)-thin part (70 nm) | 70 nm | 520 nm |
|  | 5 | Thick part (540 nm)-thin part (55 nm) | 55 nm | 540 nm |
| FIG. 16 | 2 | Thin part (40 nm)-thick part (250 nm)-thin part (100 nm)-thick part (130 nm)-thin part (60 nm) | 40-100 nm | 130-250 nm |
|  | 3 | Thick part (500 nm)-thin part (75 nm) | 75 nm | 500 nm |
|  | 4 | Thick part (580 nm) | — | 580 nm |
|  | 5 | Thick part (600 nm) | — | 600 nm |
| FIG. 17 | 2 | Thin part (65 nm)-thick part (45 nm)-thin part (30 nm)-thick part (320 nm)-thin part (100 nm) | 30-100 nm | 45-320 nm |
|  | 3 | Thick part (330 nm)-thin part (50 nm)-thick part (180 nm) | 50 nm | 180-300 nm |
|  | 4 | Thick part (60 nm)-thin part (100 nm)-thick part (300 nm)-thin part (50 nm) | 50-100 nm | 60-300 nm |
|  | 5 | Thin part (40 nm)-thick part (330 nm)-thin part (60 nm) | 40-60 nm | 330 nm |
| FIG. 18 | 2 | Thin part (80 nm)-thick part (95 nm)-thin part (95 nm)-thick part (140 nm)-thin part (70 nm) | 70-95 nm | 95-140 nm |
|  | 3 | Thick part (130 nm)-thin part (60 nm)-thick part (250 nm)-thin part (100 nm) | 60-100 nm | 130-250 nm |
|  | 4 | Thin part (70 nm)-thick part (275 nm)-thin part (90 nm)-thick part (100 nm)-thin part (40 nm) | 40-90 nm | 100-275 nm |
|  | 5 | Thin part (100 nm)-thick part (85 nm)-thin part (35 nm)-thick part (105 nm)-thin part (60 nm) | 35-100 nm | 85-105 nm |

The distributions of the widths of the thin parts and of the thick parts of each well layer calculated from Table 2 is 30 to 100 nm in the well layer 2, 30 to 100 nm in the well layer 3, 30 to 100 nm in the well layer 4 and 35 to 100 nm in the well layer 5, for the thin part, and 20 to 450 nm in the well layer 2, 60 to 580 nm in the well layer 3, 60 to 580 nm in the well layer 4 and 65 to 600 nm in the well layer 5, for the thick part.

Comparative Example 1

In the present comparative example, a gallium nitride-based compound semiconductor multilayer structure was produced according to the same method as for Example 1, except that the thicknesses of all the well layers are uniform. Namely, a gallium nitride-based compound semiconductor multilayer structure was produced according to the same method as for Example 1, except that for the first to fifth barrier layers, after the barrier layer A was formed the substrate temperature was increased to 920° C. while TEGa and $SiH_4$ were continuously supplied into the furnace, the same as for the sixth layer.

A light-emitting diode was manufactured and evaluated using the gallium nitride-based compound semiconductor multilayer structure according to the same method as for Example 1. As a result, the forward voltage at the current of 20 mA was 3.9 V. The emission wavelength was 460 nm and the emission output was 9 mW.

The initial value of the reverse voltage at 10 μA and the reverse voltage at 10 μA after the power supply at the current of 30 mA and for 100 hours were compared with each other. The changing rate of the reverse voltage was −0.5%.

Comparative Example 2

In the present comparative example, a gallium nitride-based compound semiconductor multilayer structure was produced according to the same method as for Example 1, except that the thicknesses of all the well layers are ununiform. Namely, a gallium nitride-based compound semiconductor multilayer structure was produced according to the same method as for Example 1, except that for the sixth barrier layers, after the barrier layer A was formed the substrate temperature was increased to 920° C. while TEGa and $SiH_4$ were stopped, same as for the first to fifth layers.

A light-emitting diode was manufactured and evaluated using the gallium nitride-based compound semiconductor multilayer structure according to the same method as for Example 1. As a result, the forward voltage at the current of 20 mA was 3.15 V. The emission wavelength was 460 nm and the emission output was 9 mW.

The initial value of the reverse voltage at 10 μA and the reverse voltage at 10 μA after the power supply at the current of 30 mA and for 100 hours were compared with each other. The changing rate of the reverse voltage was −7%.

Example 2

In Example 2, a gallium nitride-based compound semiconductor multilayer structure was produced according to the same method as for Example 1, except that only the well layer closest to the n-type layer has a uniform thickness. Namely, a gallium nitride-based compound semiconductor multilayer structure was produced according to the same method as for Example 1, except that for the second barrier layer, after the barrier layer A was formed the substrate temperature was increased to 920° C. while TEGa and SiH$_4$ were continuously supplied into the furnace, same as for the sixth layer of Example 1, and that for the sixth barrier layer, after the barrier layer A was formed the substrate temperature was increased to 920° C. while the supply of TEGa and SiH$_4$ into the furnace was stopped, same as for the first to fifth layers of Example 1.

A light-emitting diode was manufactured and evaluated using the gallium nitride-based compound semiconductor multilayer structure according to the same method as for Example 1. As a result, the forward voltage at the current of 20 mA was 3.3 V. The emission wavelength was 460 nm and the emission output was 10.8 mW.

Example 3

In Example 3, a gallium nitride-based compound semiconductor multilayer structure was produced according to the same method as for Example 1, except that only the third well layer from the p-type layer has a uniform thickness. Namely, a gallium nitride-based compound semiconductor multilayer structure was produced according to the same method as for Example 1, except that for the fourth barrier layer, after the barrier layer A was formed the substrate temperature was increased to 920° C. while TEGa and SiH$_4$ were continuously supplied into the furnace, same as for the sixth layer of Example 1, and that for the sixth barrier layer, after the barrier layer A was formed the substrate temperature was increased to 920° C. while the supply of TEGa and SiH$_4$ into the furnace was stopped, same as for the first to fifth layers of Example 1.

A light-emitting diode was manufactured and evaluated using the gallium nitride-based compound semiconductor multilayer structure according to the same method as for Example 1. As a result, the forward voltage at the current of 20 mA was 3.2 V. The emission wavelength was 460 nm and the emission output was 9.7 mW.

Example 4

In Example 4, a gallium nitride-based compound semiconductor multilayer structure was produced according to the same method as for Example 1, except that the two well layers closest to the p-type layer and to the n-type layer, respectively, have uniform thicknesses. Namely, a gallium nitride-based compound semiconductor multilayer structure was produced according to the same method as for Example 1, except that for the second barrier layer, after the barrier layer A was formed the substrate temperature was increased to 920° C. while TEGa and SiH$_4$ were continuously supplied into the furnace, same as for the sixth layer.

A light-emitting diode was manufactured and evaluated using the gallium nitride-based compound semiconductor multilayer structure according to the same method as for Example 1. As a result, the forward voltage at the current of 20 mA was 3.45 V. The emission wavelength was 460 nm and the emission output was 11.4 mW.

Example 5

In Example 5, a gallium nitride-based compound semiconductor multilayer structure was produced according to the same method as for Example 1, except that the first and second two well layers from the p-type layer, respectively, have a uniform thickness. Namely, a gallium nitride-based compound semiconductor multilayer structure was produced according to the same method as for Example 1, except that for the fifth barrier layer, after the barrier layer A was formed the substrate temperature was increased to 920° C. while TEGa and SiH$_4$ were continuously supplied into the furnace, the same as for the sixth layer.

A light-emitting diode was manufactured and evaluated using the gallium nitride-based compound semiconductor multilayer structure according to the same method as for Example 1. As a result, the forward voltage at the current of 20 mA was 3.2 V. The emission wavelength was 460 nm and the emission output was 10.2 mW.

Example 6

In Example 6, a gallium nitride-based compound semiconductor multilayer structure was produced according to the same method as for Example 1, except that the first to third three well layers from the p-type layer, respectively, have a uniform thickness. Namely, a gallium nitride-based compound semiconductor multilayer structure was produced according to the same method as for Example 1, except that for the fourth and fifth barrier layers, after the barrier layer A was formed the substrate temperature was increased to 920° C. while TEGa and SiH$_4$ were continuously supplied into the furnace, same as for the sixth layer.

A light-emitting diode was manufactured and evaluated using the gallium nitride-based compound semiconductor multilayer structure according to the same method as for Example 1. As a result, the forward voltage at the current of 20 mA was 3.35 V. The emission wavelength was 460 nm and the emission output was 10.2 mW.

Example 7

In Example 7, in a manner similar to Example 1, a positive electrode and a negative electrode were provided on the gallium nitride-based compound semiconductor multilayer structure obtained in Example 1. However, the positive electrode had a structure in which a transparent electrode, in which Au and NiO were stacked in this order from the p-type AlGaN contact layer, and a pad electrode, in which Ti, Au, Al and Au were stacked in this order from the p-type AlGaN contact layer, were successively formed on the p-type AlGaN contact layer side.

In a manner similar to that of Example 1, the fabricated light-emitting diode was evaluated. As a result, the diode exhibited a forward voltage of 3.2 V at a current of 20 mA, an emission wavelength of 460 nm, and an emission output of 5.5 mW. Such characteristics of the light-emitting diode can be attained without variation among light-emitting diodes cut and produced from virtually the entirety of the above-fabricated gallium nitride-based compound semiconductor multilayer structure.

Comparative Example 3

In Comparative Example 3, a light-emitting diode having the same electrode structure as employed in the diode of Example 7 was fabricated by use of the gallium nitride-based compound semiconductor multilayer structure fabricated in Comparative Example 1.

In a manner similar to that of Example 1, the fabricated light-emitting diode was evaluated. As a result, the diode exhibited a forward voltage of 3.9 V at a current of 20 mA, an emission wavelength of 460 nm, and an emission output of 5 mW.

Comparative Example 4

In Comparative Example 4, a light-emitting diode having the same electrode structure as employed in the diode of Example 7 was fabricated by use of the gallium nitride-based compound semiconductor multilayer structure fabricated in Comparative Example 2.

In a manner similar to that of Example 1, the fabricated light-emitting diode was evaluated. As a result, the diode exhibited a forward voltage of 3.15 V at a current of 20 mA, an emission wavelength of 460 nm, and an emission output of 5 mW.

The light-emitting device produced from the gallium nitride-based compound semiconductor multilayer structure of the present invention operates at low voltage while maintaining satisfactory light emission output. Thus, the present invention is of remarkably great value in the industry.

What is claimed is:

1. A gallium nitride-based compound semiconductor multilayer structure comprising a substrate having thereon a n-type layer, a light-emitting layer and a p-type layer, the light-emitting layer having a multiple quantum well structure in which a well layer and a barrier layer are alternately stacked repeatedly and the light-emitting layer being provided between the n-type layer and the p-type layer, wherein the well layers constituting the multiple quantum well structure comprise a well layer having an ununiform thickness and a well layer having a uniform thickness.

2. The gallium nitride-based compound semiconductor multilayer structure according to claim 1, wherein the thickness of the well layer closest to the p-type layer is uniform.

3. The gallium nitride-based compound semiconductor multilayer structure according to claim 1, wherein the thickness of the well layer closest to the n-type layer is uniform.

4. The gallium nitride-based compound semiconductor multilayer structure according to claim 1, wherein the thickness of a well layer having a uniform thickness is 1.8 to 5 nm.

5. The gallium nitride-based compound semiconductor multilayer structure according to claim 1, wherein the thickness of a thin part of a well layer having an ununiform thickness is not more than 2.7 nm 6. The gallium nitride-based compound semiconductor multilayer structure according to claim 1, wherein the multiple quantum well structure comprises 3 to 10 stacks of the well layer and the barrier layer.

7. The gallium nitride-based compound semiconductor multilayer structure according to claim 1, wherein the barrier layer comprises a gallium nitride-based compound semiconductor selected from the group consisting of GaN, AlGaN and InGaN having a In ratio smaller than that of InGaN which forms the well layer.

8. The gallium nitride-based compound semiconductor multilayer structure according to claim 7, wherein the barrier layer comprises GaN.

9. The gallium nitride-based compound semiconductor multilayer structure according to claim 1, wherein the barrier layer contains a dopant.

10. The gallium nitride-based compound semiconductor multilayer structure according to claim 9, wherein the dopant is at least one selected from the group consisting of C, Si, Ge, Sn, Pb, O, S, Se, Te, Po, Be, Mg, Ca, Sr, Ba and Ra.

11. The gallium nitride-based compound semiconductor multilayer structure according to claim 9, wherein the concentration of the dopant is from $1 \times 10^{17}$ to $1 \times 10^{18}$ cm$^{-3}$.

12. The gallium nitride-based compound semiconductor multilayer structure according to claim 1, wherein the thickness of the barrier layer is from 7 to 50 nm.

13. The gallium nitride-based compound semiconductor multilayer structure according to claim 12, wherein the thickness of the barrier layer is at least 14 nm.

14. The gallium nitride-based compound semiconductor multilayer structure according to claim 1, wherein the well layer contains In.

15. The gallium nitride-based compound semiconductor multilayer structure according to claim 14, wherein a thin layer containing no In is provided on at least the substrate side of the barrier layer.

16. A gallium nitride-based compound semiconductor light-emitting device, wherein the device has a negative electrode and a positive electrode, the negative electrode and the positive electrode being provided on the n-type layer and the p-type layer of a gallium nitride-based compound semiconductor multilayer structure according to claim 1.

17. A lamp in which the gallium nitride-based compound semiconductor light-emitting device according to claim 16 is used.

18. A method for manufacturing the gallium nitride-based compound semiconductor multilayer structure according to claim 1, wherein after a well layer is formed, the layer thus formed is partly decomposed or sublimated to provide an ununiform thickness.

19. The method for manufacturing a gallium nitride-based compound semiconductor multilayer structure, according to claim 18, wherein the substrate temperature T1 during forming the well layer and the substrate temperature T2 during decomposing or sublimating a part of the well layer satisfy the formula: $T1 \leq T2$.

20. The method for manufacturing a gallium nitride-based compound semiconductor multilayer structure, according to claim 18, wherein the decomposition or sublimation of a part of the well layer is conducted in an atmosphere containing a nitrogen source and containing no III group metal source.

21. The method for manufacturing a gallium nitride-based compound semiconductor multilayer structure, according to claim 18, wherein the decomposition or sublimation of a part of the well layer is conducted during forming the barrier layer.

* * * * *